(12) United States Patent
Yoshida et al.

(10) Patent No.: US 6,829,285 B2
(45) Date of Patent: Dec. 7, 2004

(54) SEMICONDUCTOR LASER DEVICE AND METHOD FOR EFFECTIVELY REDUCING FACET REFLECTIVITY

(75) Inventors: Junji Yoshida, Chiyoda-ku (JP); Naoki Tsukiji, Chiyoda-ku (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/107,077

(22) Filed: Mar. 28, 2002

(65) Prior Publication Data

US 2003/0062528 A1 Apr. 3, 2003

(30) Foreign Application Priority Data

Sep. 28, 2001 (JP) ........................................ 2001-300491

(51) Int. Cl.[7] .............................. H01S 3/08; H01S 5/00
(52) U.S. Cl. ........................ 372/102; 372/103; 372/49; 372/50
(58) Field of Search .............................. 372/43–50, 99, 372/102–103

(56) References Cited

U.S. PATENT DOCUMENTS

| | | | | |
|---|---|---|---|---|
| 5,416,866 A | * | 5/1995 | Sahlen ........................ 385/37 |
| 5,459,747 A | * | 10/1995 | Takiguchi et al. ............ 372/50 |
| 5,612,550 A | * | 3/1997 | Gomyo et al. ............... 257/184 |
| 5,678,935 A | * | 10/1997 | Sakata ........................ 385/131 |
| 5,715,268 A | * | 2/1998 | Lang et al. .................... 372/50 |
| 5,717,711 A | * | 2/1998 | Doussiere et al. .......... 372/102 |
| 5,754,714 A | * | 5/1998 | Suzuki et al. .................. 385/5 |
| 5,757,828 A | * | 5/1998 | Ouchi .......................... 372/27 |
| 5,789,274 A | * | 8/1998 | Yamaguchi et al. .......... 438/32 |
| 5,891,748 A | * | 4/1999 | Sakata ......................... 438/31 |
| 5,991,322 A | * | 11/1999 | Takiguchi et al. ............ 372/50 |
| 6,108,481 A | * | 8/2000 | Tohyama et al. ............ 385/131 |
| 6,151,351 A | * | 11/2000 | Kito et al. ..................... 372/96 |
| 6,384,963 B2 | | 5/2002 | Ackerman et al. |
| 6,417,958 B1 | * | 7/2002 | Du et al. ..................... 359/334 |
| 6,455,876 B1 | * | 9/2002 | Kikawa et al. ............... 257/98 |
| 6,526,075 B2 | * | 2/2003 | Mizutani ...................... 372/27 |
| 6,580,740 B2 | * | 6/2003 | Funabashi et al. ............ 372/50 |

FOREIGN PATENT DOCUMENTS

JP 05-167199 7/1993

* cited by examiner

*Primary Examiner*—Minsun Oh Harvey
*Assistant Examiner*—Phillip Nguyen
(74) *Attorney, Agent, or Firm*—Oblon, Spivak, McClelland, Maier & Neustadt, P.C.

(57) ABSTRACT

A semiconductor laser device includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer and the laser device is configured to operate as a multiple mode oscillation device. A window structure is provided between an end of the active layer and one of the light reflecting and light emitting facets, and the window structure is configured to reduce a reflectivity of the one of the light reflecting and light emitting facets.

40 Claims, 25 Drawing Sheets

SEMICONDUCTOR LASER DEVICE 20

SEMICONDUCTOR LASER DEVICE 21

- 10 POSITIVE ELECTRODE
- 7 InGaAsP CONTACT LAYER
- 6 p-InP CLAD LAYER
- 9 n-InP BLOCKING LAYER
- 8 p-InP BLOCKING LAYER
- 2 n-InP BUFFER LAYER
- 1 n-InP SUBSTRATE
- 11 NEGATIVE ELECTRODE
- 3 GRIN-SCH-MQW ACTIVE LAYER
- 2 n-InP BUFFER LAYER
- 13 DIFFRACTION GRATING
- 4 p-InP SPACER LAYER

26 WINDOW STRUCTURE REGION

REFLECTION FILM 14

RADIATION SIDE REFLECTION FILM 15

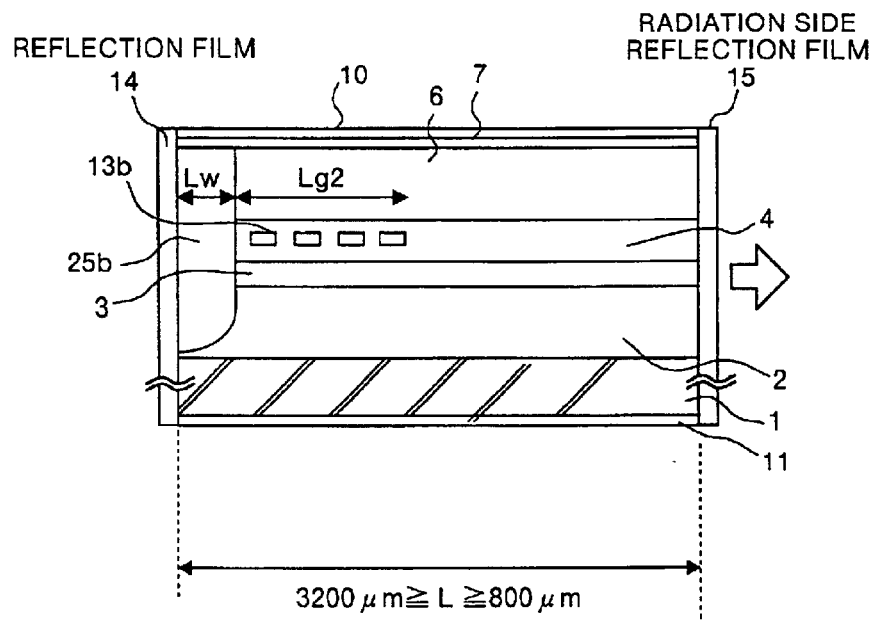
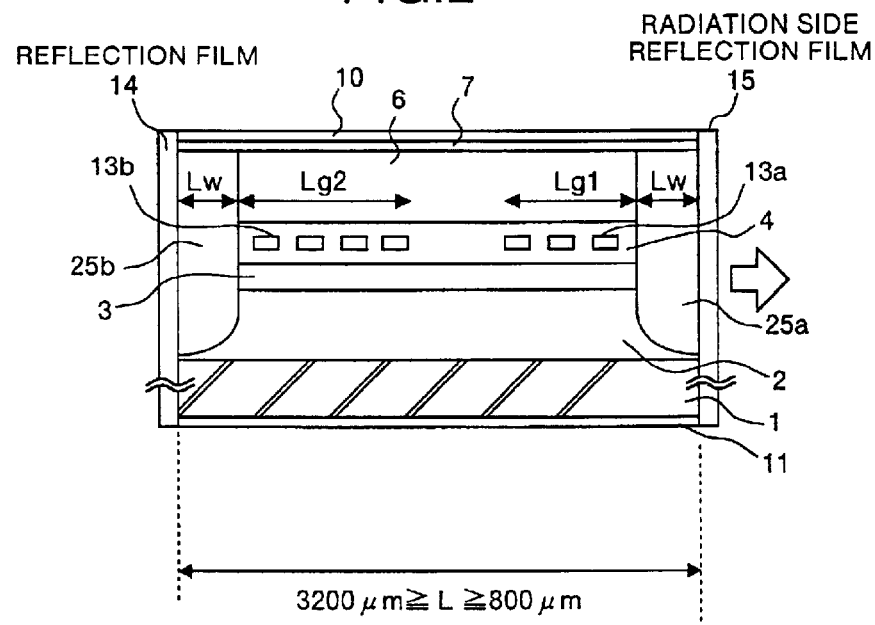

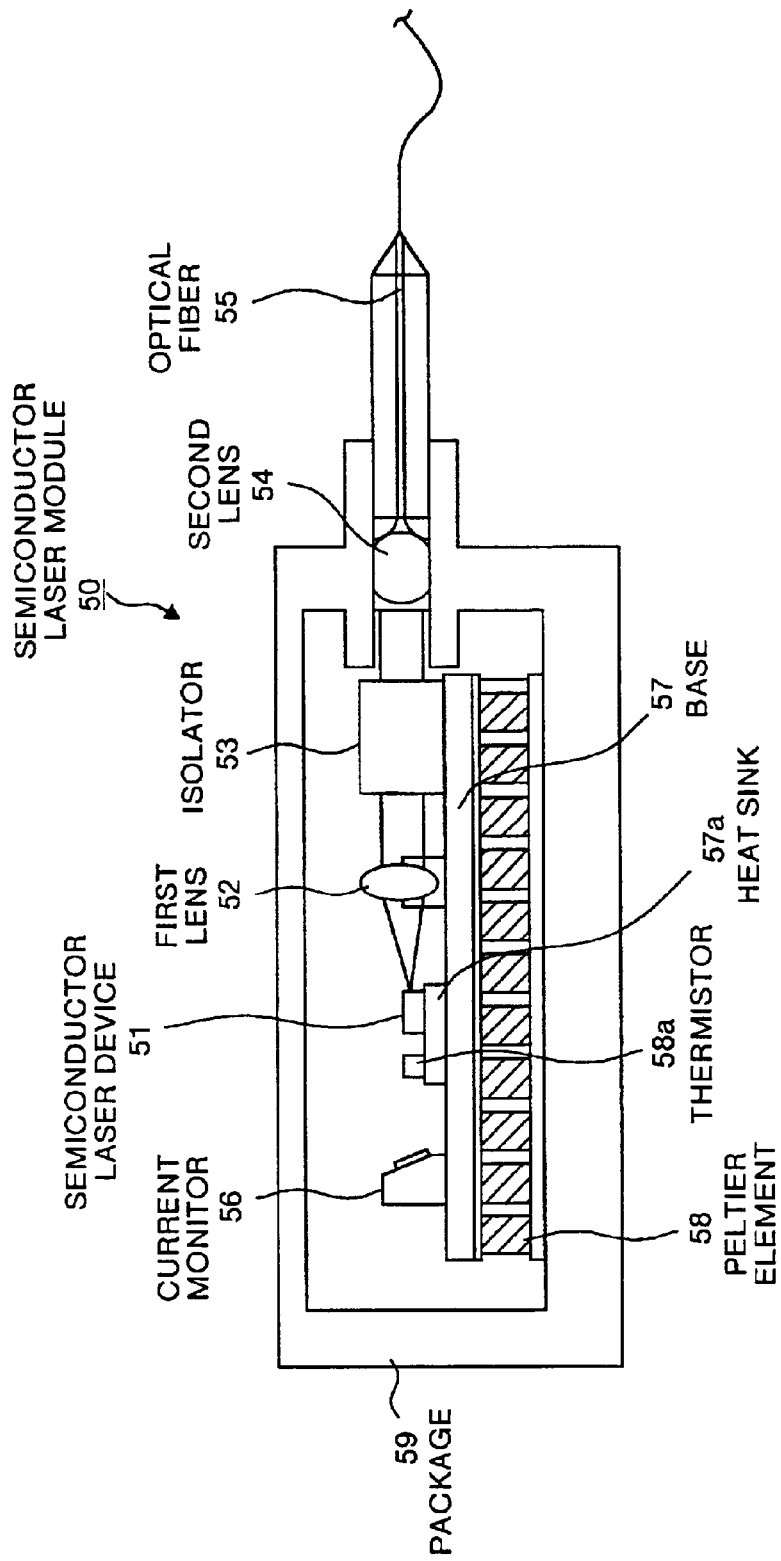

SEMICONDUCTOR LASER DEVICE AND METHOD FOR EFFECTIVELY REDUCING FACET REFLECTIVITY

CROSS REFERENCE TO RELATED APPLICATIONS

This application contains subject matter related to U.S. patent application Ser. No. 09/832,885 filed on Apr. 12, 2001, Ser. No. 09/983,175 filed on Oct. 23, 2001, Ser. No. 09/983,249 filed on Oct. 23, 2001, and Ser. No. 10/014,513, filed on Dec. 14, 2001. The entire contents of each of these applications is incorporated herein by reference.

FIELD OF THE INVENTION

The present invention relates generally to semiconductor laser device, and in particular to a semiconductor laser device used as a pumping source for an optical amplifier.

BACKGROUND OF THE INVENTION

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route, which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped Fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam (The pumping wavelength is approximately 100 nm shorter than the signal wavelength which is typically in the vicinity of 1500 nm.) Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

For the EDFA and Raman amplifiers, it is desirable to have a high output laser device as a pumping source. This is particularly important for the Raman amplifier, which amplifies signals over a wide wavelength band, but has relatively small gain. Such high output is generally provided by a pumping source having multiple longitudinal modes of operation. The Furukawa Electric Co., Ltd. has recently developed an integrated diffraction grating device that provides a high output multiple mode laser beam suitable for use as a pumping source in a Raman amplification system. An integrated diffraction grating device, as opposed to a fiber brag grating device, includes the diffraction grating formed within the semiconductor laser device itself. Examples of multiple mode oscillation integrated diffraction grating devices are disclosed in U.S. patent application Ser. No. 09/832,885 filed Apr. 12, 2001, Ser. No. 09/983,175 filed on Oct. 23, 2001, and Ser. No. 09/983,249 filed on Oct. 23, 2001, assigned to The Furukawa Electric Co., Ltd. and the entire contents of these applications are incorporated herein by reference.

As disclosed in the Ser. Nos. 09/832,885, 09/983,175, and 09/983,249 patent applications, a multiple longitudinal mode oscillation laser device having an integrated diffraction grating preferably has a low reflectivity at the light emitting facet of the laser device. As recognized by the present inventors, this low reflectivity of the light emitting facet of the laser device suppresses the Fabry-Perot oscillation of the device, thereby eliminating kinks in the current to light output (I-L) curve of the device and enhancing high output power operation. Such a low reflectivity is generally provided by an antireflective coating on the cleaved facet of the laser device. However, the present inventors have recognized that such antireflective coatings are difficult to produce due to limitations in thickness control of the coating process. Moreover, the present inventors have also recognized that antireflective coating techniques are limited for producing very low reflectivity over the wide wavelength band necessary for multiple mode operation.

SUMMARY OF THE INVENTION

Accordingly, one object of the present invention is to provide a laser device and method for providing a light source suitable for use as a pumping light source in a Raman amplification system, but which overcomes the above described problems.

Another object of the present invention is to provide a laser device having suppressed Fabry-Perot oscillations.

Yet another object of the present invention is to provide a laser device that effectively reduces the reflectivity of a laser facet of the semiconductor device.

According to a first aspect of the present invention, a semiconductor device and method for providing a light source suitable for use as a pumping light source in a Raman amplification system are provided. The device upon which the method is based includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer and the laser device is configured to operate as a multiple mode oscillation device. A window structure is provided between an end of the active layer and one of the light reflecting and light emitting facets, and the window structure is configured to reduce a reflectivity of the one of the light reflecting and light emitting facets.

Where the window structure is provided between a light emitting end of the active layer and the light emitting facet, the window structure has a length Lw sufficient to provide an effective reflectivity Reff of less than 0.1% for the light emitting facet. Similarly where the window structure is provided between a light reflecting end of the active layer and the light reflecting facet, the window structure has a length Lw sufficient to provide an effective reflectivity Reff of less than 0.1% for the light reflecting facet. The light emitting facet or the light reflecting facet may include a reflective coating to reduce the reflectivity value of such facet. Moreover, the window structure may be provided at both the light emitting and light reflecting end of the laser device. The window structure may be a buried structure of Fe doped InP material or a disordered crystal portion of the active layer made from Zn atoms or point defects.

According to another aspect of the invention, a semiconductor laser module, an optical amplifier, a Raman amplifier, or a wavelength division multiplexing system may be provided with a semiconductor laser device having an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer and the laser device is configured to operate as a multiple mode oscillation device. A window structure is provided between an end of the active layer and one of the light reflecting and light emitting facets, and the window structure is configured to reduce a reflectivity of the one of the light reflecting and light emitting facets.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 22 is a vertical sectional view in the longitudinal direction of a semiconductor laser device having a diffraction grating and window structure on the light reflecting side of the device in accordance with the present invention;

FIG. 23 is a vertical sectional view in the longitudinal direction of a semiconductor laser device having a diffraction grating and window structure on both the light reflecting side and the light emitting side of the device in accordance with the present invention;

FIG. 24 is a vertical sectional view illustrating the configuration of a semiconductor laser module having a semiconductor laser device according to the present invention;

DESCRIPTION OF THE PREFERRED EMBODIMENTS

Figure 1:
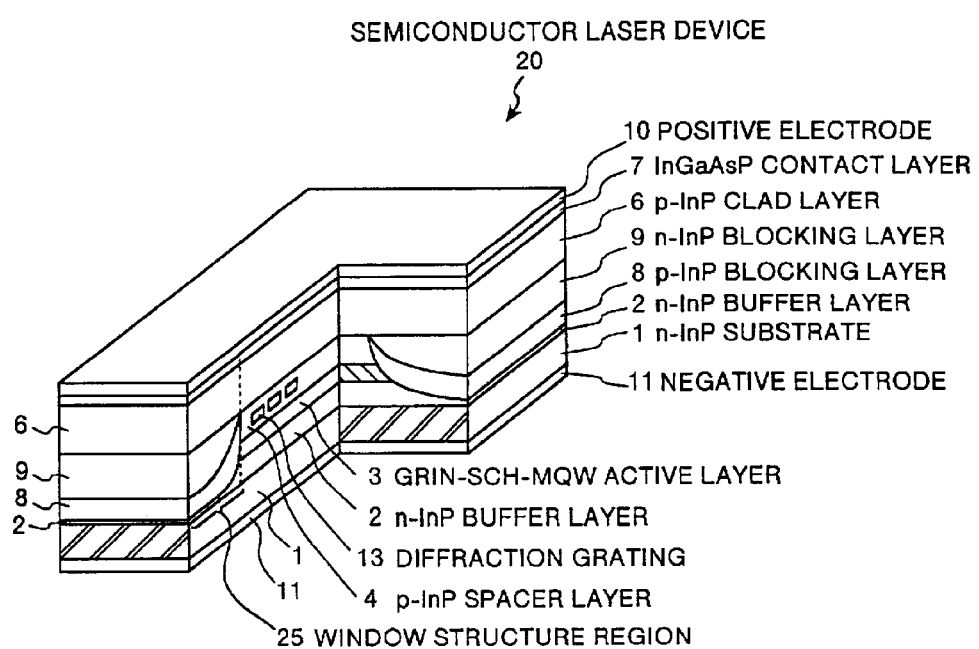
FIG. 1 is a cutaway view of a semiconductor laser device according to a first embodiment of the present invention.
Figure 2:
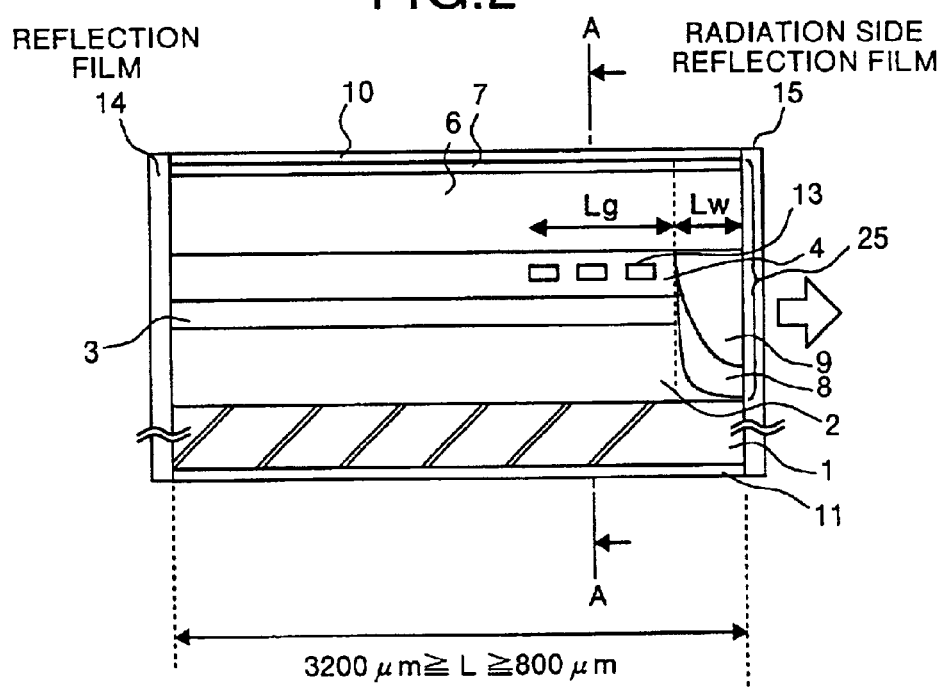
FIG. 2 is a vertical sectional view in the longitudinal direction of a semiconductor laser according to the first embodiment of the present invention.
Figure 3:
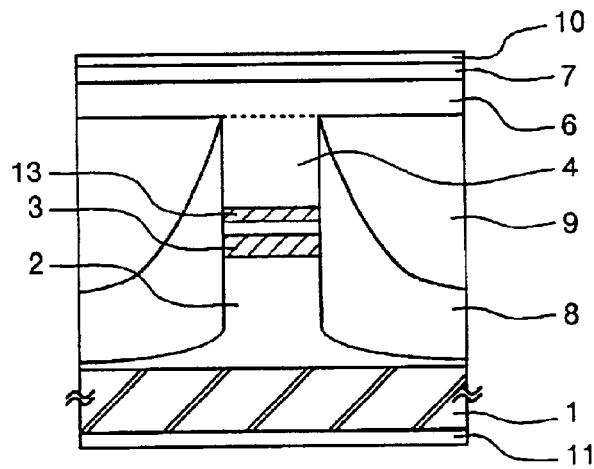
FIG. 3 is a cross sectional view along the line A—A of the semiconductor laser device shown in FIG. 2.

Referring now to the drawings wherein like elements are represented by the same reference designation throughout, and more particularly to FIGS. 1 through 3 thereof, there is shown a semiconductor laser device for providing a light source suitable for use as a pumping light source in a Raman amplification system, in accordance with a first embodiment of the present invention. FIG. 1 is a cutaway view of the semiconductor device, FIG. 2 is a vertical sectional view in the longitudinal direction of the semiconductor laser device, and FIG. 3 is a cross sectional view of the semiconductor laser device, taken along the line A—A in FIG. 2.

The semiconductor laser device 20 of FIGS. 1 through 3 includes an n-InP substrate 1 having an n-InP buffer layer 2, an active layer 3, a p-InP spacer layer 4, a p-InP cladding layer 6, and a P-InGaAsP contact layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW) structure. A diffraction grating 13 of a p-InGaAsP material is periodically formed within the p-InP spacer layer 4 along a portion of the entire length of active layer 3. In addition, a window structure region 25 is formed at a light emitting end of the active layer 3. Finally, a p-side electrode 10 is formed on the upper surface of p-InGaAsP cap layer 7, and an n-side electrode 11 is formed on the back surface of n-InP substrate 1.

As seen in FIG. 2, reflective film 14 having high reflectivity of, for example, 80% or more, and preferably 98% or more is formed on a light reflecting end surface that is one end surface in the longitudinal direction of the semiconductor laser device 20. Antireflection coating 15 having a low reflectivity of, for example, less than 5%, less than 1%, or less than 0.5%, and most preferably less than 0.1% is formed on a light irradiating end surface opposing the light reflecting end surface of semiconductor laser device 20. It is also noted that the present invention is useful for laser devices having a relatively high reflective coating 15 of less than 30% or less than 10%, for example. The laser device having this relatively high reflective coating 15 is suitable to prevent a returning light from entering into the laser device. The reflective film 14 and the antireflection coating 15 form an optical resonator within the active region 3 of the semiconductor laser device 20. A light beam generated inside the GRIN-SCH-MQW active layer 3 of the light resonator is reflected by the reflective film 14 and irradiated as an output laser beam via the antireflection coating 15, while being selected by the diffraction grating 13.

The laser device 20 of FIGS. 1–3 is constructed so as to provide multiple longitudinal mode oscillation of the laser device. Thus, as seen in FIG. 2, the resonator length L is preferably from 800–3200 microns as described in U.S. Patent Application No. P1361, which is incorporated herein by reference. In the embodiment of FIGS. 1 through 3, the diffraction grating 13 has a length Lg of approximately 50 $\mu$m, a grating layer thickness of 20 nm, a grating pitch of 220 nm, and selects a laser beam having a central wavelength of 1480 nm to be emitted by the semiconductor laser device 20.

As best seen in FIG. 3, the p-InP spacer layer 4 having the diffraction grating 13, the GRIN-SCH-MQW active layer 3, and the upper part of the n-InP buffer layer 2 are processed in a mesa stripe shape. The sides of the mesa stripe are buried by a p-InP blocking layer 8 and an n-InP blocking layer 9 formed as current blocking layers. It is also noted that a single transverse mode is maintained by this buried heterostructure. As shown by FIG. 2, in the first embodiment of the present invention, the window structure 25 is also formed by embedded p-InP blocking layer 8 and an n-InP blocking layer 9. The current blocking layers 8 and 9 are made of a material having a lower index of refraction than active layer 3. The present inventors have discovered that an integrated diffraction grating laser device having such a low refractive index window structure formed between the light emitting end of the GRIN-SCH-MQW active layer 3 and the light emitting film 15 provides a stable and efficient output for multiple mode oscillation.

Figure 4:
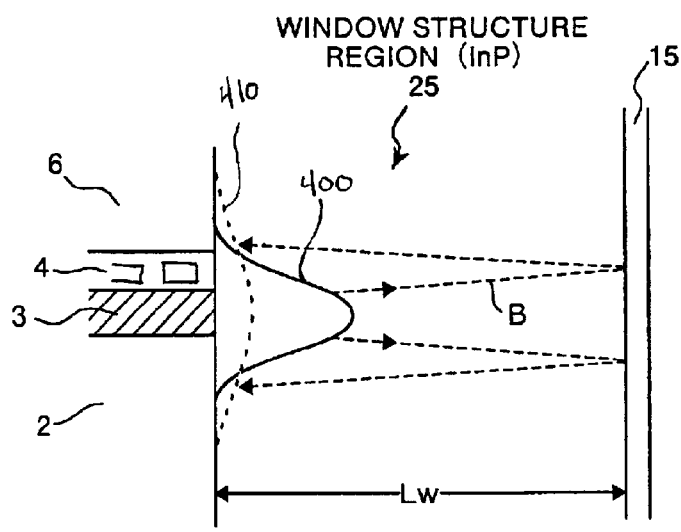
FIG. 4 is an expanded view of the light emitting side of the laser device showing the effect of the window structure on the light output beam of a laser device in accordance with the present invention.

FIG. 4 is an expanded view of the light emitting side of the laser device 20 showing the effect of the window structure 25 on light output beam of the laser device 20 in accordance with the present invention. As seen in FIG. 4, a laser beam profile 400 is output from the GRIN-SCH-MQW active layer 3 to the window structure region 25. Because the window structure 25 has a lower index of refraction than the active layer 3, the laser beam (beam B) is spread by diffraction in the window structure region 25. That is, since the index of refraction of the window structure region 25 is smaller than that of the GRIN-SCH-MQW active layer 3, a band gap of the window structure region 25 becomes wide making it difficult to absorb light and thereby widening a beam profile of the laser beam B. As a result, even if the laser beam is reflected by the radiation side reflection film 15, a beam profile 410 of the reflected light arriving at the active layer 3 is significantly widened. In this regard, it is noted that the intensity distribution of the laser beams in FIG. 4 are indicated with approximation of Gaussian distribution. With the widened profile 410, a probability that the reflected laser beam is input to the active layer 3 again is extremely low and an effective reflectivity Reff in the window structure region 25 is extremely small. Such a low effective reflectivity from the coating 15 suppresses the Fabry-Perot oscillation and reduces the possibility of a phase mismatch between the Fabry-Perot reflections and the grating reflections, thereby enhancing the stability and efficiency of the multi mode oscillation.

Figure 5:
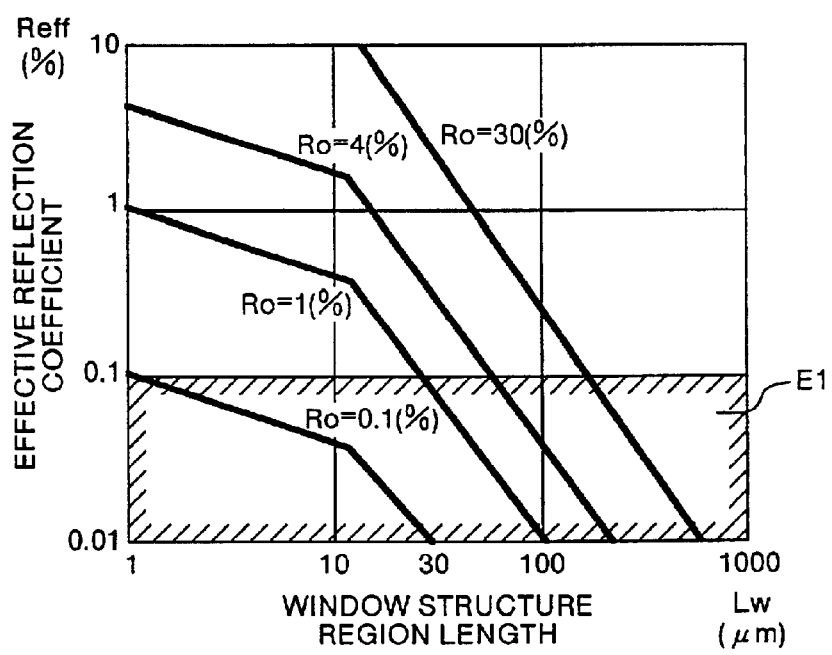
FIG. 5 is a graph plotting the effective reflectivity Reff of the window structure region as a function of the window structure region length Lw, for various reflectivity Ro of the radiation side reflection film.

FIG. 5 is a graph plotting the effective reflectivity Reff of the window structure region 25 as a function of the window structure region length Lw, for various reflectivities Ro of the radiation side reflection film 15. As seen in this figure, the effective reflectivity Reff for a given Ro is reduced as the window structure region length Lw is increased. Moreover, if the window structure region length Lw is held constant, the effective reflectivity Reff is reduced as the reflectivity Ro is reduced. As seen in FIG. 5, in order to make the effective reflectivity Reff less than 0.1%, it is necessary to have window structure region length Lw and the reflectivity Ro plotted in a region E1 shown in FIG. 5.

Figure 6:
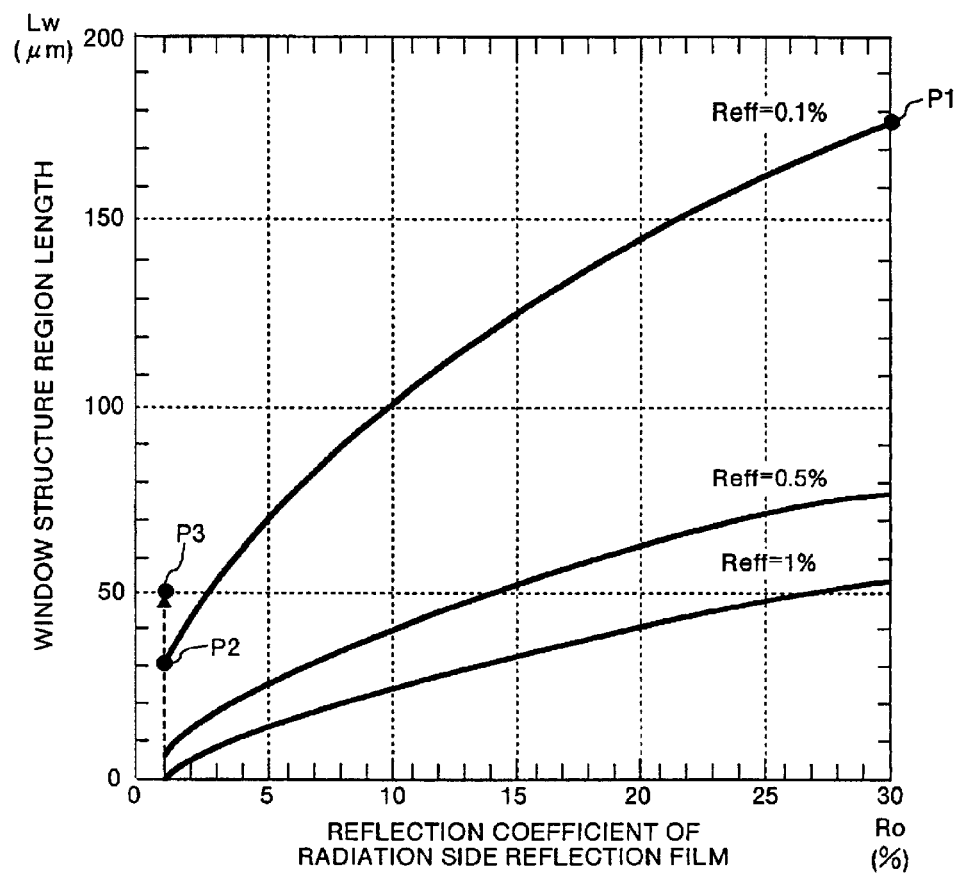
FIG. 6 is a graph showing the window structure region length Lw and reflectivity Ro of the radiation side reflection film needed to achieve a desired reflectivity Reff.

FIG. 6 is a graph showing the window structure region length Lw and reflectivity Ro of the radiation side reflection film 15 needed to achieve a desired effective reflectivity Reff. In FIG. 6, in order to make the effective reflectivity Reff less than 0.1%, it is necessary to have a window structure region length Lw located in a region above a curve of Reff=0.1%. For example, if an oscillation wavelength λo is 1.48 μm, an index of refraction n of the window structure region 25 is 3.18 and a reflectivity Ro at the time of cleavage is 30%, then, in order to bring the effective reflectivity Reff to a value less than 0.1%, the window structure region length Lw may be set to a value exceeding 175 μm as indicated by point P1 of FIG. 6. If a radiation side reflection film 15 having the reflectivity Ro of 1% is to be formed by coating the light emitting side of the device, the effective reflectivity Reff can be brought into a value less than 0.1% by bringing the window structure region length Lw into a value exceeding 30 μm as indicated by point 2. In this case, since a manufacturing process margin is necessary for producing an actual device, the window structure region length Lw may be about 50 μm as shown by point 3. FIG. 6 also shows the Lw and Ro values needed to achieve a Reff value of 0.5% and 1%. Thus, as shown by FIGS. 5 and 6, the length Lw of the window structure 25 and reflectivity Ro of the reflecting film 15 may be selected to achieve a low effective reflectivity Reff.

Figure 7A:
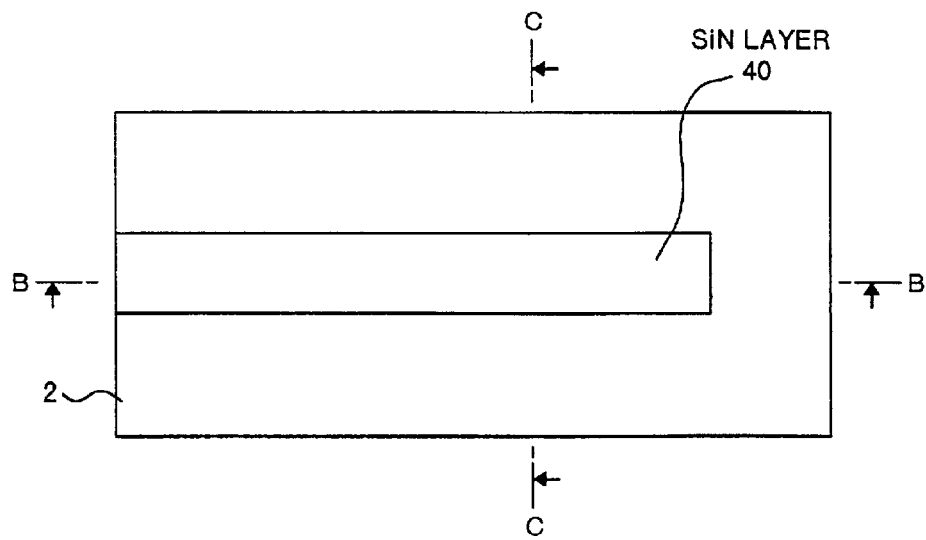
FIGS. 7A, 7B and 7C illustrate the etching step used to form a mesa stripe structure and a window structure region of a device in accordance with the present invention.
Figure 7B:
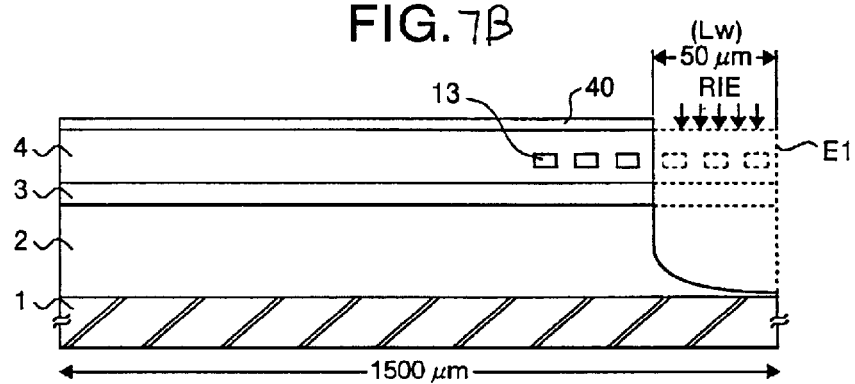
Figure 7C:
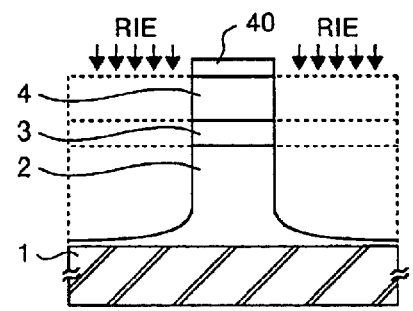

FIGS. 7–9 illustrate a method of manufacturing the semiconductor laser device of FIGS. 1–3. Each of FIGS. 7–9 include A, B and C views of the laser device 20 at the manufacturing step illustrated by the Figure. FIG. A is a plan view of the semiconductor laser device, while FIG. B is a sectional view of device taken along line B—B of FIG. A, and FIG. C is a sectional view of the device taken along line C—C of FIG. A. FIGS. 7A, 7B and 7C illustrate the etching step used to form the mesa stripe structure and to form the window structure region of the device. As seen in these figures, the n-InP clad layer 2, the GRIN-SCH-MQW active layer 3 and the P-InP spacer layer 4 including the diffraction grating 13 are sequentially laminated on the (100) plane of the n-InP substrate 1. Thereafter, a SiN layer 40 functioning as a mask is formed on the P-InP spacer layer 4. The SiN layer 40 is a mask for forming a mesa stripe shape in which a final GRIN-SCH-MQW active layer 3 is shaped. As best seen in FIG. 7A, the SiN layer 40 is not formed on the radiation side of the laser device so that a window structure region of 50 μm length may be formed on the light emitting side of the device. With the SiN mask layer formed, the longitudinal side surfaces of the multilayer structure are etched into a mesa stripe shape by reactive ion etching (RIE) or wet etching as shown in FIG. 7C. Moreover, as shown in FIG. 7B, the radiation side of the device is simultaneously etched by a length of about 50 μm from the emitting end to form a region in which the window structure will be embedded.

Figure 8A:
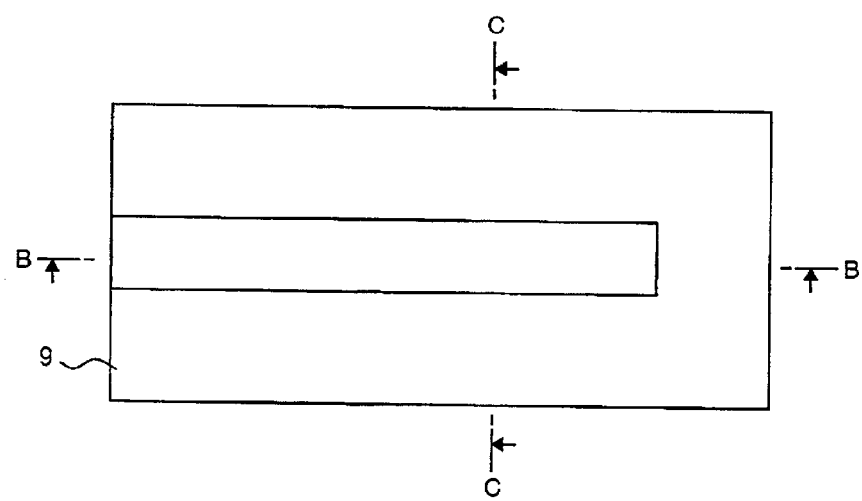
FIGS. 8A, 8B, and 8C illustrate a current blocking layer and windows structure forming step for a device in accordance with the present invention.
Figure 8B:
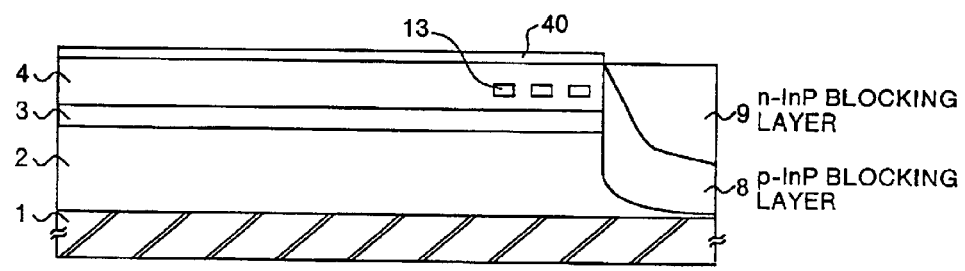
Figure 8C:
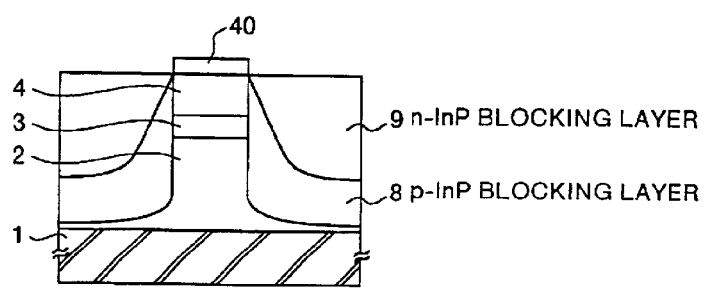

FIGS. 8A, 8B, and 8C illustrate a current blocking layer and window structure forming steps for the device of the first embodiment. As seen in these figures, the p-InP blocking layer 8 and the n-InP blocking layer 9 are sequentially embedded in the areas etched by the etching process of FIGS. 7A–7C. Thus the longitudinal sides of the mesa stripe and the window structure region are simultaneously formed by embedding the blocking layers 8 and 9. As noted above, the embedded p-InP blocking layer 8 and the n-InP blocking layer 9 have a lower index of refraction as compared with that of the GRIN-SCH-MQW active layer 3.

Figure 9A:
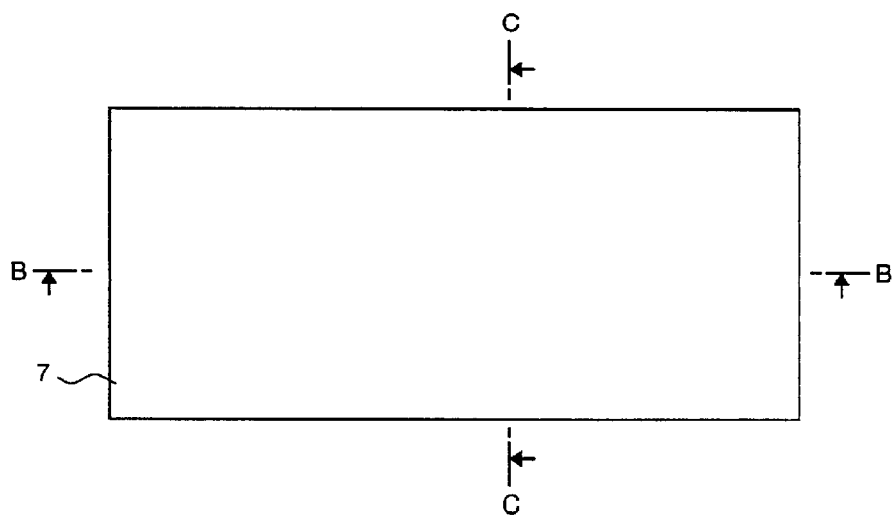
FIGS. 9A, 9B, and 9C illustrate the process steps of forming an upper cladding layer and a contact layer on the mesa stripe and window structures formed in FIGS. 8A–8C.
Figure 9B:
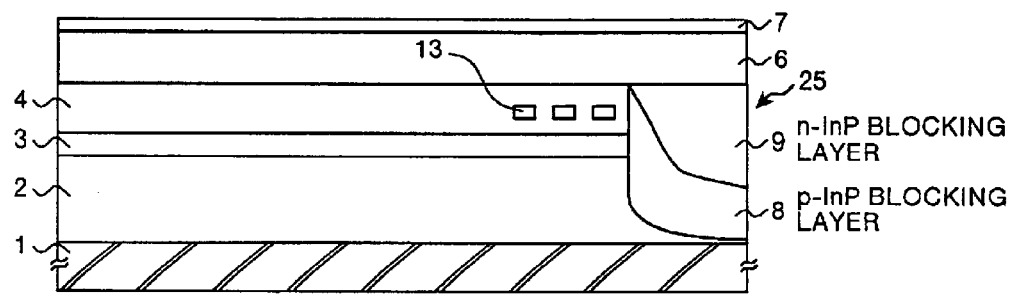
Figure 9C:
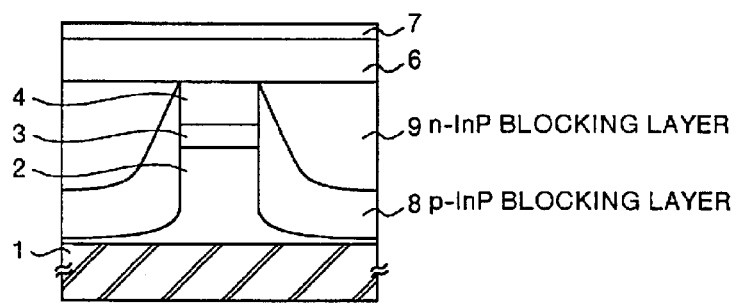

FIGS. 9A, 9B, and 9C illustrate the process steps of forming an upper cladding and a contact layer on the mesa stripe and window structures formed in FIGS. 8A–8C. As shown in these Figures, the SiN layer 40 is removed and then, a p-InP clad layer 6 is formed on upper surfaces of the P-InP spacer layer 4 and the n-InP blocking layer 9. Further, a P-InGaAsP contact layer 7 is formed on the p-InP clad layer 6. As a result, a window structure region 25 corresponding to the window structure region 25 in the semiconductor laser device shown in FIGS. 1 to 3 is formed. Then, the positive electrode 10 is formed on an upper surface of the P-InGaAsP contact layer 10, and a negative electrode 11 is formed on a back surface of the n-InP substrate 11. After cleavage, the reflection film 14 and the radiation side reflection film 15 are formed on the cleavage plane, thereby forming the semiconductor laser device.

Thus, FIGS. 7–9 illustrate a manufacturing embodiment of the present invention wherein the window structure region 25 is formed by growing the p-InP blocking layer 8 and the n-InP blocking layer 9 in the window structure 25 simultaneously with growing these layers in the mesa stripe structure. Such a process allows the window structure region 25 to also function as a current blocking layer making it possible to omit a complicated procedures for forming a current non injection area, such as eliminating a p side electrode material from the window structure area, which will be further described below. Moreover, the process of simultaneously forming the mesa stripe structure and the window structure realizes an efficient method of producing the laser device. However, the present invention is not limited to such simultaneous formation.

Figure 10:
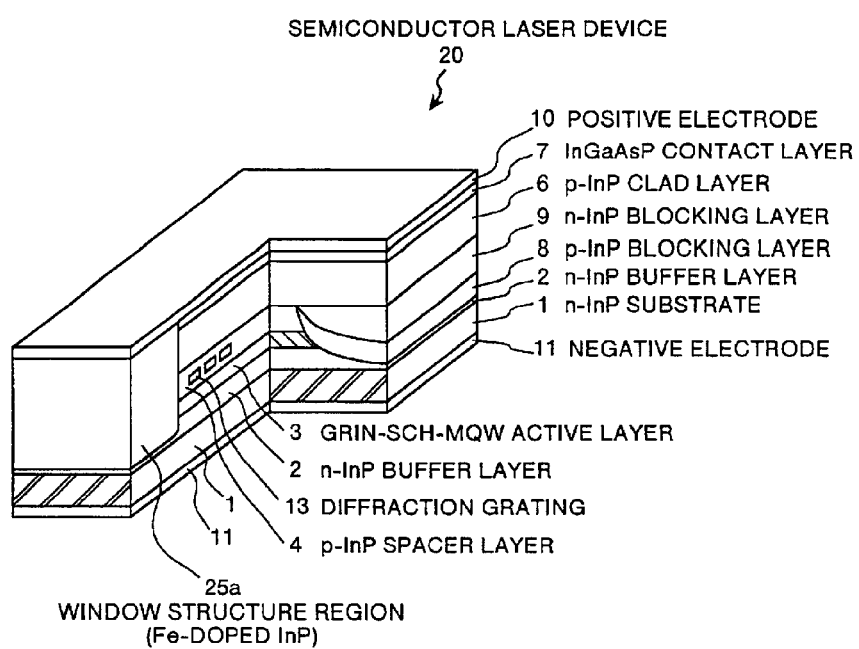
FIGS. 10–12 illustrate a device and process wherein the window structure region is formed independently of current blocking layer in accordance with the present invention.
Figure 11:
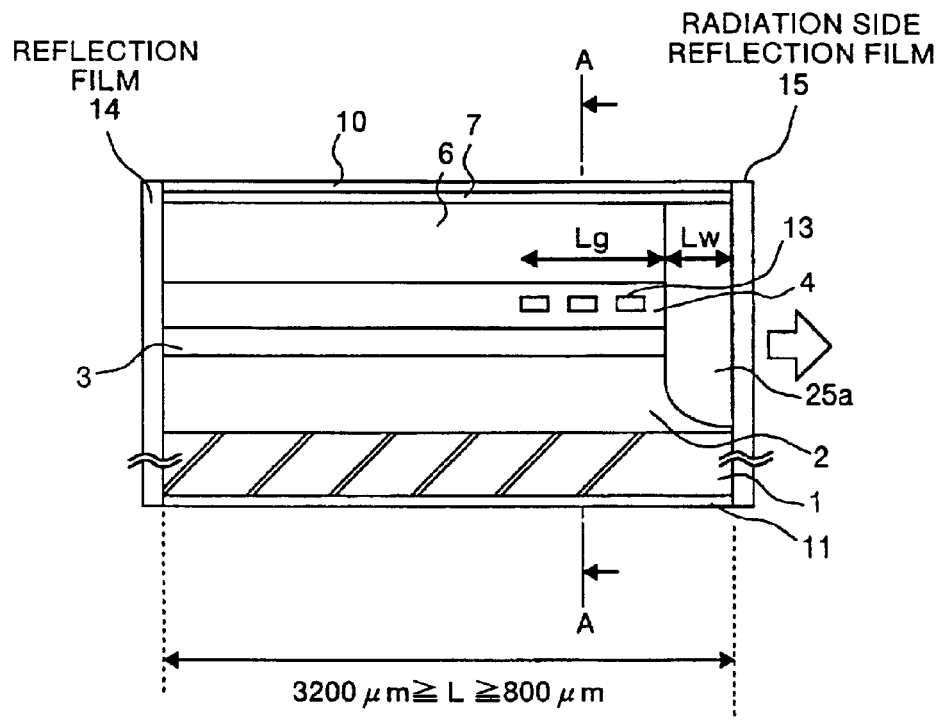
Figure 12:
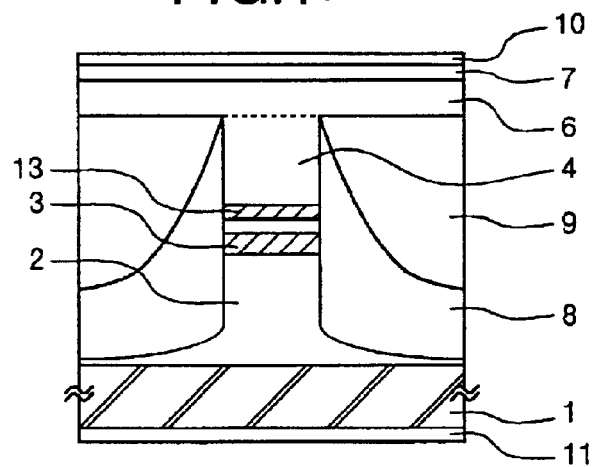
Figure 13:
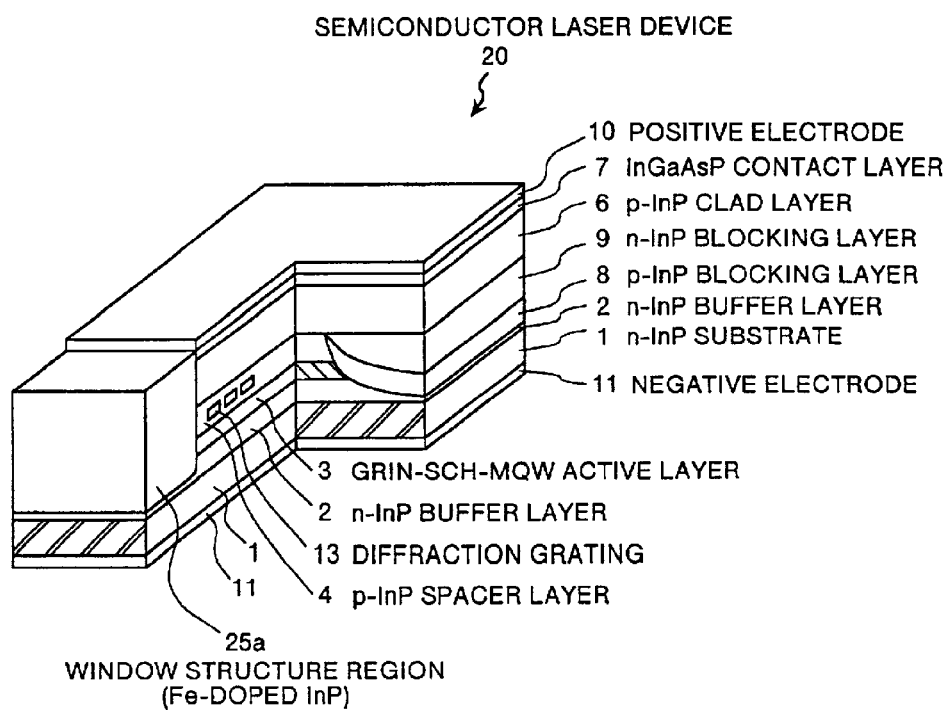
FIG. 13 is a cutaway view of a semiconductor laser device of the present invention having the p side electrode eliminated from the window structure region so that current does not flow into the window structure region.

FIGS. 10–12 illustrate a device and process wherein the window structure region 25 is formed independently of the current blocking layers. As seen in these figures, the window structure 25a is provided as an Fe-doped InP material. As is appreciated by one of ordinary skill in the art, the device of FIGS. 10–12 may be formed by embedding the Fe-doped InP material in the window region prior to forming the positive electrode 10. Moreover, since the window structure region 25a is doped with Fe, this area assumes semi-insulative nature making the Fe window region perform as a current non injection area even where the electrode 10 is formed in this area. The present inventors have recognized, however, that notwithstanding the current suppression characteristics of the window structure itself, it may be desirable to further suppress current in the area of the window structure. FIG. 13 is a cutaway view of a semiconductor laser device having the p side electrode 10 eliminated from the window structure region 25a so that current does not flow into the window structure region 25a. As noted above, this structure may also be applied to a device having the window structure region 25 of FIGS. 1–3. Moreover, methods that may be used to suppress current in a portion of the semiconductor laser device are disclosed in U.S. patent application Ser. No. 10/014,513, filed Dec. 14, 2001, the entire contents of which is incorporated herein by reference. As would be understood by one of ordinary skill in the art, any of the methods described in U.S. patent application Ser. No. 10/014,513 may be applied to the window structure region of the present invention.

Figure 14:
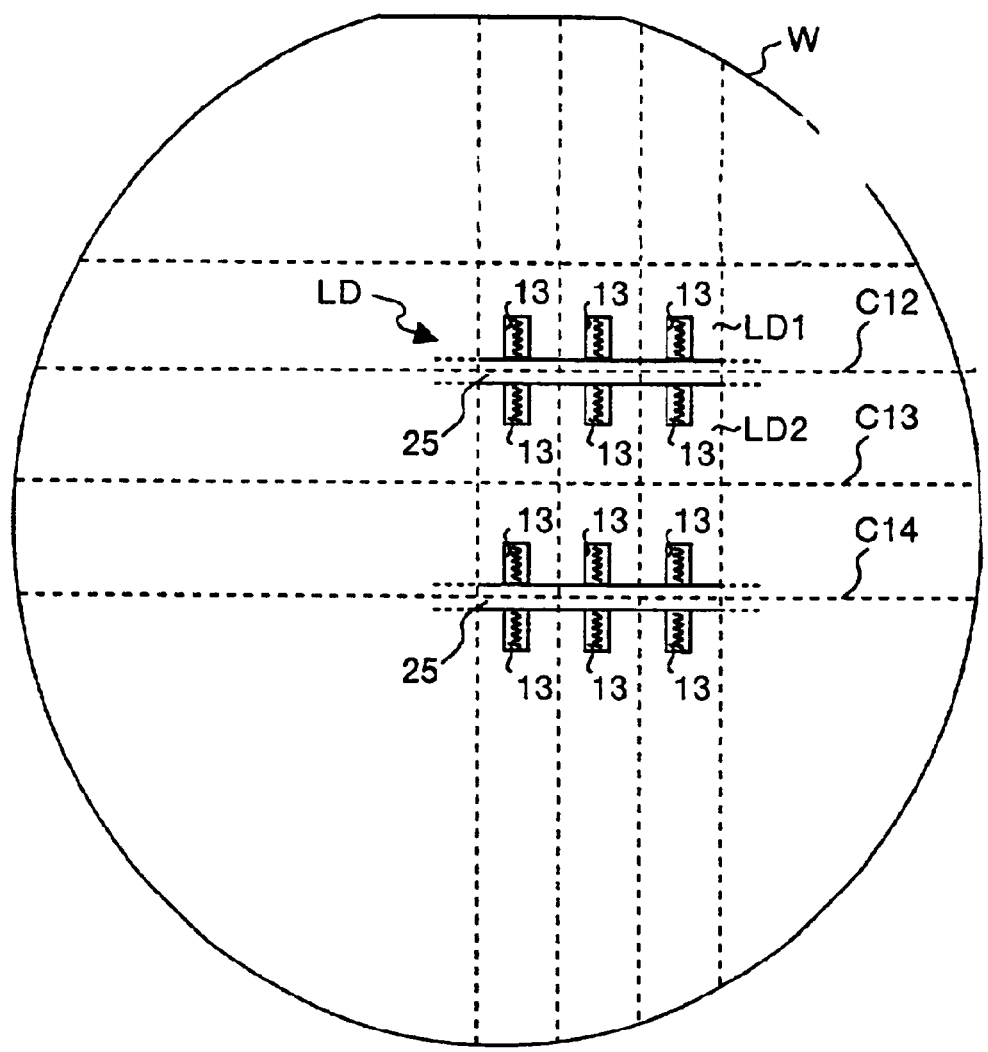
FIG. 14 is a plan view of a semiconductor wafer having formed thereon a plurality of the semiconductor laser devices having a window structure according to the present invention.

Although the devices and manufacturing processes of the first embodiment are described with respect to individual semiconductor laser devices, the present invention may be realized by simultaneously forming the window structure as an integral structure covering two adjacent laser devices on a semiconductor wafer having a plurality of laser devices. FIG. 14 is a plan view of a semiconductor wafer having formed thereon a plurality of the semiconductor laser devices having a window structure according to the present invention. As seen in FIG. 14, the plurality of semiconductor laser devices are separated by cleavage boundaries where the devices will be cleaved into discrete devices. For example, semiconductor laser devices LD1, LD2 are formed adjacent to one another on the wafer w, with a boundary C12 therebetween. The boundary C12 corresponds to a cleavage plane along which the laser device LD1 and LD2 will be separated. C13 and C14 also represent cleavage planes.

As also seen in FIG. 14, a window structure region 25 is integrally formed across the boundary C12. Thus, when the wafer 12 is cleaved into discrete laser devices, the window structure 25 will be formed on each of the laser devices LD1 and LD2. Moreover, even if actual cleavage position is different than the boundary C12 due to process variations, a window structure region 25 will reliably exist at the light emitting side of the laser devices LD1 and LD2. That is, the window structures 25 of LD1 and LD2 are disposed so as to be opposed to each other on the wafer w. As a result, the window structures 25 are disposed at positions symmetrical with respect to the cleavage plane C12. If the window structure region length Lw is 50 $\mu$m, a width of the window structure regions opposed to each other and integrally formed is 100 $\mu$m. In an actual case, the positional deviations of the cleavage planes C12 (and C14) are taken into account. For example, margins of about 5 $\mu$m are necessary for each device and therefore, a width of the integrally formed window structure regions needs a margin of about 10 $\mu$m.

In the first embodiment, the window structure regions 25 and 25a are provided, allowing an effective reflectivity Reff of the radiation side to be easily set to less than 0.1%. Moreover, an arbitrary effective reflectivity Reff can be realized by changing the window structure region length Lw and reflectivity Ro of the coating 15. Therefore, unnecessary oscillation of the Fabry-Perot mode can be suppressed, the stability of the oscillation and output power can be enhanced. In the above first embodiment, the semiconductor laser device is formed by embedding the window structure regions 25 and 25a. However, the effects of the first embodiment may be achieved by forming an disordered crystal structure in a portion of the active layer 3 to form the window structure.

Figure 15:
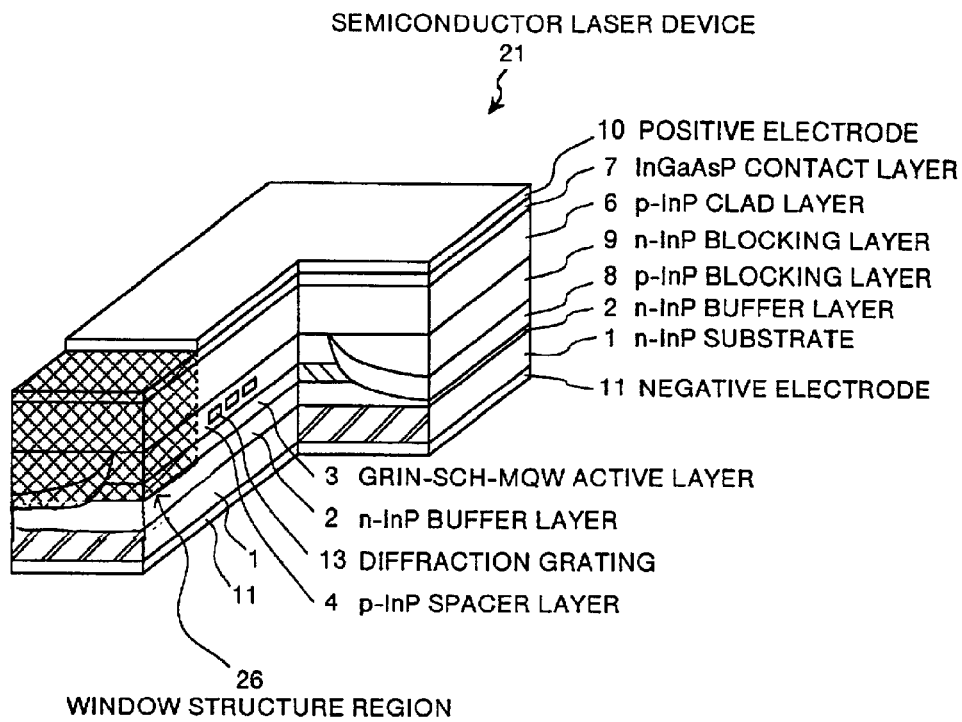
FIG. 15 is a cutaway view of a semiconductor laser device according to a second embodiment of the present invention.
Figure 16:
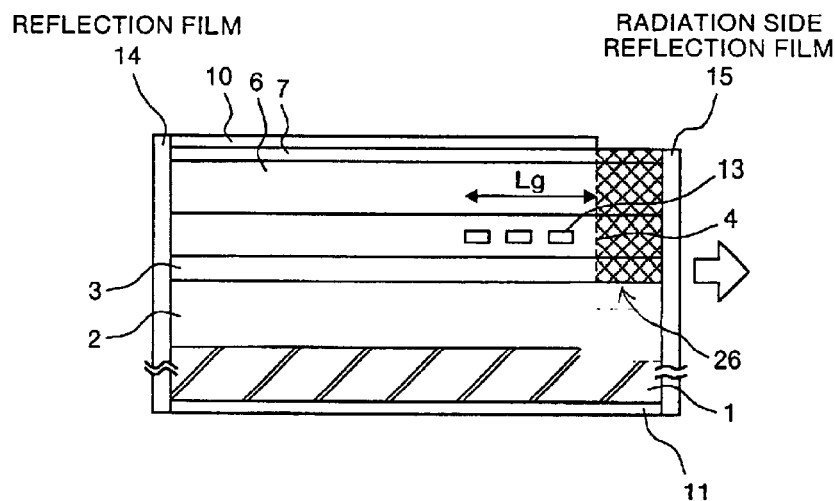
FIG. 16 is a vertical sectional view in the longitudinal direction of the semiconductor laser device shown in FIG. 15.

FIG. 15 is a cutaway view of a semiconductor laser device according to a second embodiment of the present invention, while FIG. 16 is a vertical sectional view in the longitudinal direction of the semiconductor laser device shown in FIG. 15. The semiconductor laser device of FIGS. 15 and 16 is substantially the same as the device of the first embodiment of the present invention except for the configuration of the window structure. Specifically, Zn is diffused as atoms to form disordered crystal window structure region 26. The index of refraction of the disordered window structure region 26 is smaller than that of the superlattice structure of the GRIN-SCH-MQW active layer 3, and band gap energy also becomes large. As a result, laser beam output from the GRIN-SCH-MQW active layer 3 spreads in the window region thereby achieving the results of the first embodiment described with respect to FIGS. 4–6. The positive electrode 10 is not formed on the upper surface of the window structure region 26 so as to reliably prevent current injection into the window structure region 26 as discussed above.

Figure 17A:
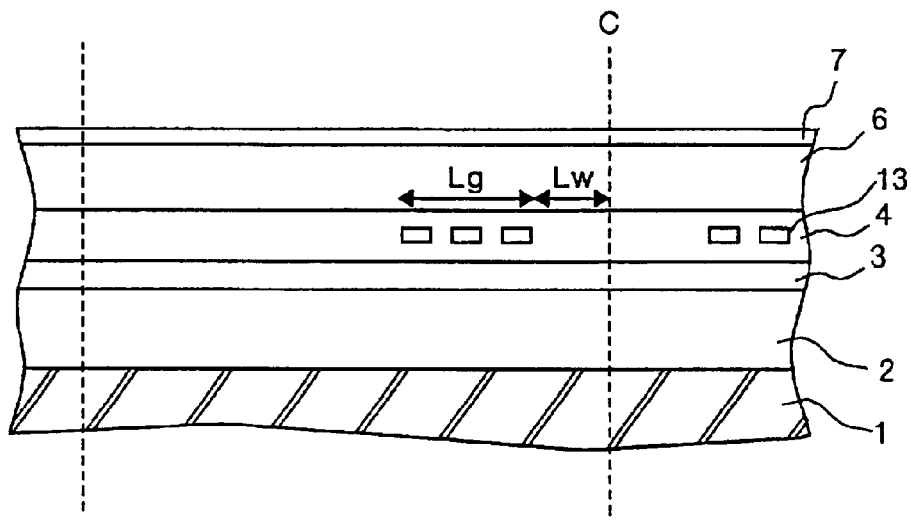
FIGS. 17A and 17B are semiconductor process views showing a method of collectively producing semiconductor laser devices of the second embodiment of the invention on a semiconductor wafer.
Figure 17B:
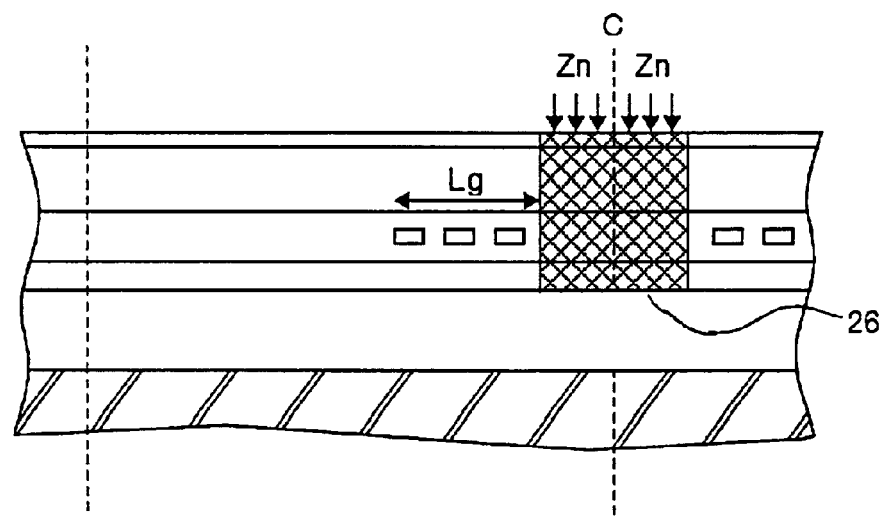

FIGS. 17A and 17B are semiconductor process views showing a producing procedure of semiconductor laser devices collectively formed on a semiconductor wafer of the second embodiment of the invention. As seen in FIGS. 17A and 17B, the n-InP clad layer 2, the GRIN-SCH-MQW active layer 3 and the P-InP spacer layer 4 including the diffraction grating 13, the p-InP clad layer 6 and the P-InGaAsP contact layer 7 are sequentially laminated on the (100) plane of the n-InP substrate 1. In this case, the diffraction gratings 13 of the semiconductor laser devices are disposed so as to be opposed to each other. That is, the diffraction gratings 13 are located substantially symmetrically with respect to the cleavage plane C. However, no diffraction grating 13 is formed in regions of the window structure region length Lw on the opposite sides of the cleavage plane C as shown in FIG. 17A.

Then, as shown in FIG. 17B, Zn atoms are added to a region corresponding to the window structure region 26, and the Zn is thermally diffused thereby disordering the superlattice structure of the GRIN-SCH-MQW active layer 3. By way of this process, the index of refraction in the Zn area becomes smaller than that of the GRIN-SCH-MQW active layer 3, and a window structure region 26 has a larger band gap energy. As a result, the laser beam output to the window structure region 26 from the GRIN-SCH-MQW active layer 3 spreads thereby achieving the results described with respect to FIGS. 4–6. The Zn atoms, or other atoms such as S may be added by any method such as ion implantation, for example. Moreover, the disordered crystal may be realized by radiating proton ($H^+$) atoms into the window structure region 26.

Figure 18:
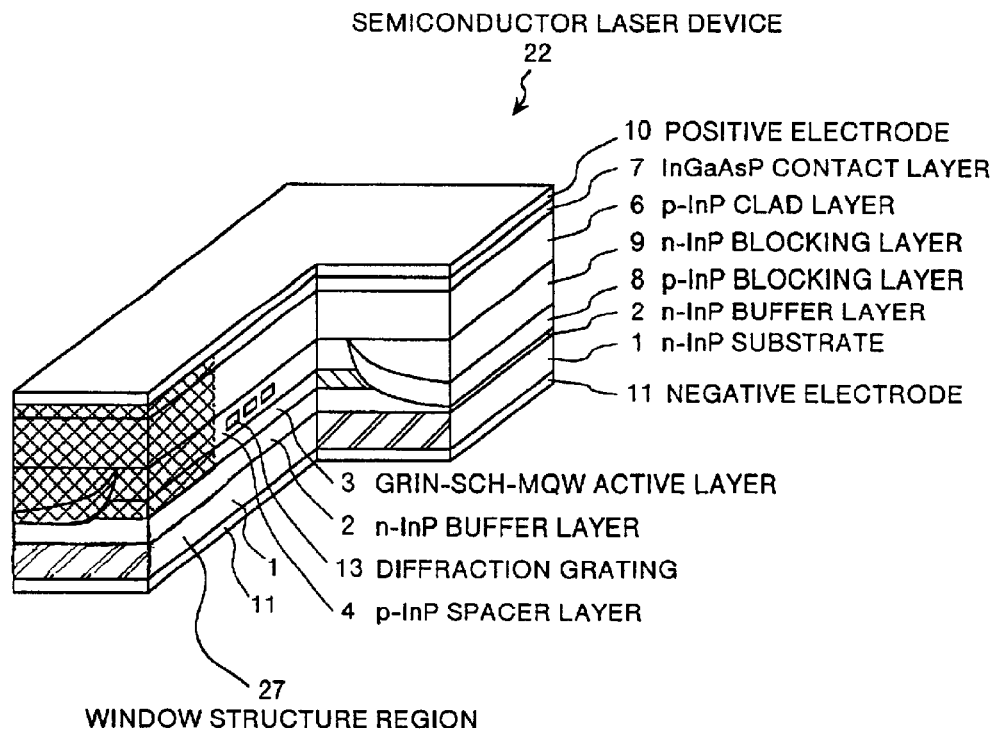
FIG. 18 is a cutaway view of a semiconductor laser device according to a variation of the second embodiment of the invention.
Figure 19:
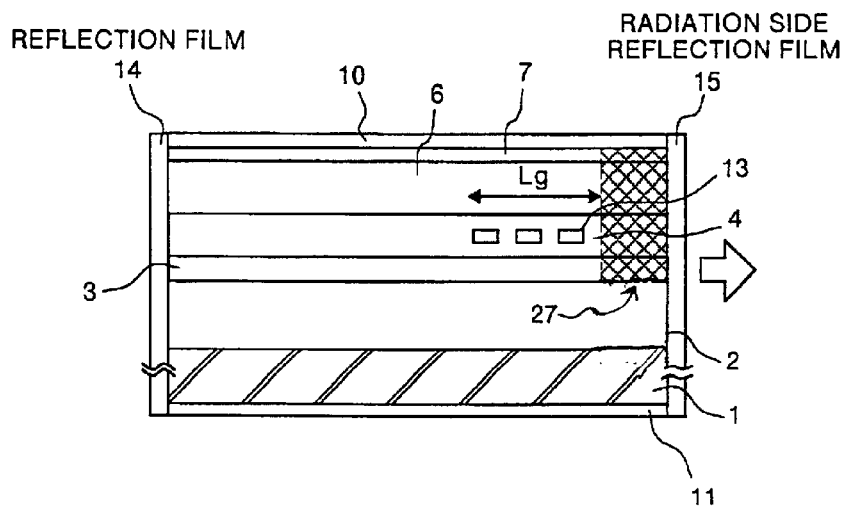
FIG. 19 is a vertical sectional view in the longitudinal direction of the semiconductor laser device shown in FIG. 18.

FIG. 18 is a cutaway view of a semiconductor laser device according a variation of the second embodiment of the invention, while FIG. 19 is a vertical sectional view in the longitudinal direction of the semiconductor laser device shown in FIG. 18. The device shown in FIGS. 18 and 19 is substantially the same as the embodiment of FIGS. 15 and 16, except for the configuration of the window structure. Specifically, rather than forming an disordered structure in a portion of the active layer by diffusion of atoms, the disordered structure is formed by generation and dispersion of point defects. Thus, as seen in FIGS. 18 and 19, in a semiconductor laser device 22, a window structure region 27 is formed in a region corresponding to the window structure region 26 shown in the second embodiment. As also seen in these figures, a positive electrode 10 is formed on the entire upper surface of the P-InGaAsP contact layer 7. Like the second embodiment, however, the positive electrode 10 may be omitted from the area corresponding to the upper surface of the window structure region 27.

Figure 20A:
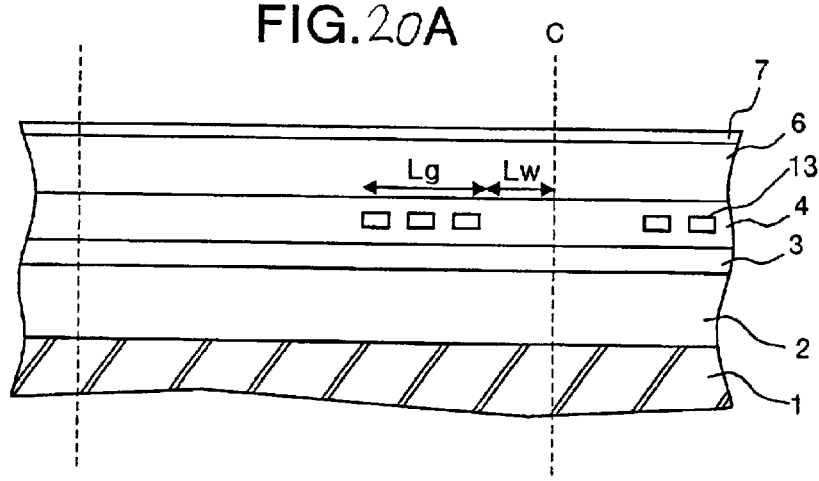
FIGS. 20A, 20B and 20C are semiconductor process views showing a method of collectively producing semiconductor laser devices of the third embodiment of the invention on a semiconductor wafer.
Figure 20B:
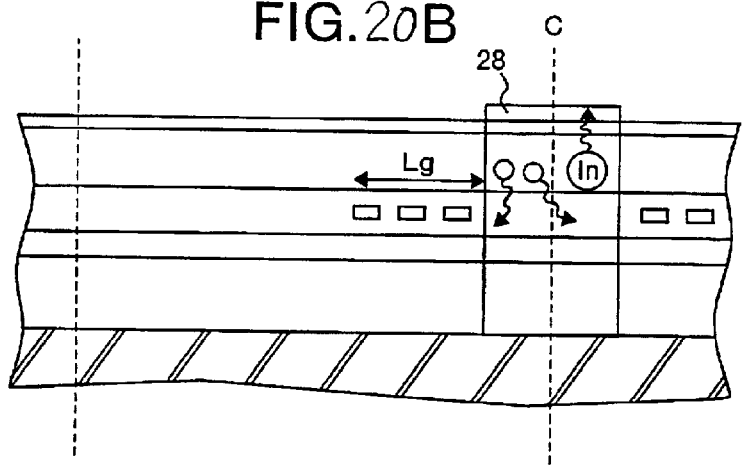
Figure 20C:
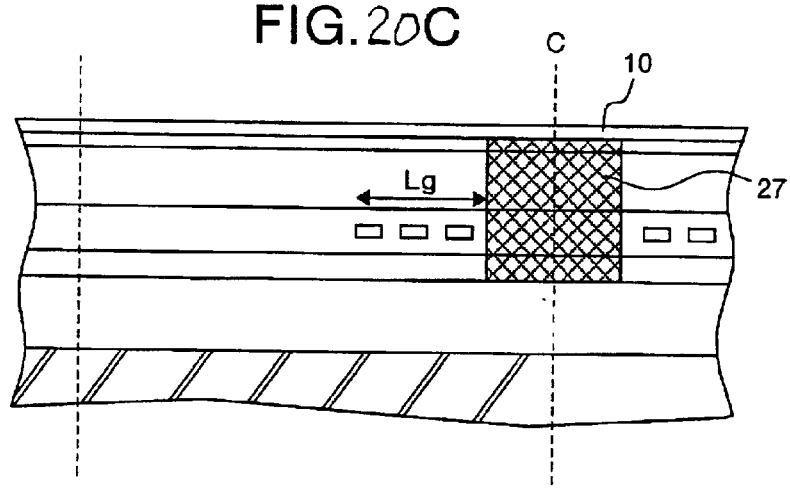

FIGS. 20A, 20B and 20C are semiconductor process views showing a method of collectively producing semiconductor laser devices of the third embodiment of the invention on a semiconductor wafer. As seen in FIGS. 20A, 20B and 20C, the n-InP clad layer 2, the GRIN-SCH-MQW active layer 3, the P-InP spacer layer 4 including the diffraction grating 13, the p-InP clad layer 6 and the P-InGaAsP contact layer 7 are sequentially laminated on the (100) plane of the n-InP substrate 1. The GRIN-SCH-MQW active layer 3 and p-InP spacer including diffraction grating are formed into mesa structure and then, the side portion of mesa structure is buried using a current blocking layer (p-InP blocking layer 8 and n-InP blocking layer 9) to form a Buried Heterostructure. As with the previous embodiments, the diffraction gratings 13 of the semiconductor laser devices are disposed so as to be opposed to each other. That is, the diffraction gratings 13 are located symmetrically with respect to the cleavage plane C. However, no diffraction grating 13 is formed in regions from opposite sides of the cleavage plane C by the window structure region length Lw as shown in FIG. 20A.

Thereafter, as shown in FIG. 20B, an $SiO_2$ film 28 is formed on an upper surface of the P-InGaAsP contact layer 7 corresponding to the window structure region 27, and is subjected to thermal treatment. By this thermal treatment, a large amount of In atoms in the superlattice structure of the GRIN-SCH-MQW active layer 3 is sucked into the $SiO_2$ film 28 leaving many vacancies in the lattice structure. Further, the point defects are dispersed by the thermal treatment and disordered crystal is induced in the window structure 27 as also shown in FIG. 20B. Thereafter, the SiO$_2$ film 28 having poor heat dissipation ability is removed, and the positive electrode 10 is formed on the upper surface of the P-InGaAsP contact layer 7 as shown in FIG. 20C.

As a result, the index of refraction of the window structure region 27 becomes smaller than that of the superlattice structure of the GRIN-SCH-MQW active layer 3, and the band gap energy becomes larger. With this variation in index of refraction, the laser beam output from the GRIN-SCH-MQW active layer 3 to the window structure region 27 spreads and a probability that the light returns to the GRIN-SCH-MQW active layer 3 again is remarkably reduced. Therefore the effective reflectivity can be set to less than 1% and preferably less than 0.1%. While the above-described embodiment is described with reference to SiO$_2$ film 28 formed on the upper surface of the window structure region 27, the invention is not limited to this structure and any film suitable for sucking elements and inducing disordered crystal may be used. This diffusion process is also available for the process before making mesa structure.

Figure 21:
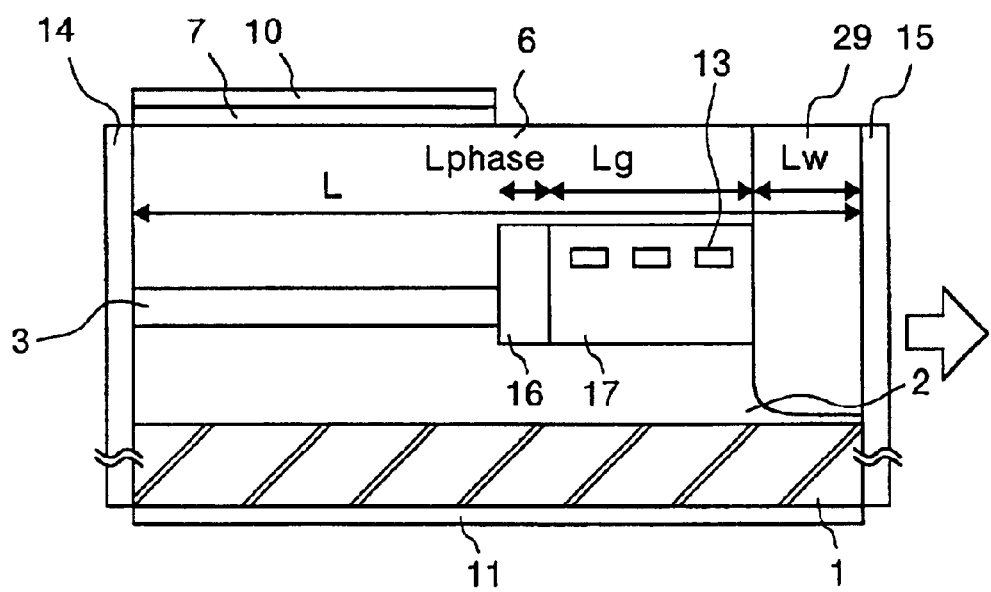
FIG. 21, shows a third embodiment of the present invention wherein the diffraction grating is formed along an optical waveguide of the semiconductor device.

In each of the embodiments described above, the semiconductor laser device is partially provided with the diffraction grating 13 along the GRIN-SCH-MQW active layer 3, but the invention is not limited to this structure. FIG. 21, shows a third embodiment of the present invention wherein the diffraction grating is formed along an optical waveguide of the semiconductor device. In the semiconductor laser device shown in FIG. 21, an optical waveguide layer 16, an optical waveguide layer 17 including the diffraction grating 13, and a window structure region 29 are sequentially disposed in the longitudinal direction (laser beam emitting direction) from the GRIN-SCH-MQW active layer 3. The window structure region 29 is connected to the radiation side reflection film 15, and has a structure corresponding to any one of the window structure regions 25, 25a, 26 and 27. With the semiconductor laser device shown in FIG. 21, an effective reflectivity Reff of less than 0.1% can be realized by the window structure region 29 and the radiation side reflection film 15 as previously described.

The first to third embodiments describe the present invention with reference to the diffraction grating 13 provided in the vicinity of the radiation side reflection film 15. In each of these embodiments, it is preferable that the diffraction grating length Lg and the resonator length L are set to satisfy the relationship Lg×(1300 μm/L)≦300 μm. Moreover, the diffraction grating 13 is preferably constructed such that a value obtained by multiplying a coupling coefficient κ of the diffraction grating by a diffraction grating length Lg is set to 0.3 or less. By setting these parameters, multimode operation of the laser device having a diffraction grating on a light emitting side can be achieved. Examples of devices having a diffraction grating provided in the vicinity of the radiation side reflecting film may be found in U.S. patent application Ser. No. 09/983,249, which is incorporated herein by reference. It is to be understood, however, the present invention is not limited to devices having a diffraction grating provided in the vicinity of the radiation side reflecting film 15.

FIG. 22 is a vertical sectional view in the longitudinal direction of a semiconductor laser device having a diffraction grating and window structure on the light reflecting side of the device in accordance with the present invention. As seen in this figure, the diffraction grating 13b is provided in the vicinity of the reflection film 14. With such a configuration, it is preferable that the diffraction grating length Lg2 and the resonator length L are set to satisfy the relationship Lg≦1/2L. Moreover, the diffraction grating 13 is preferably constructed such that a value obtained by multiplying a coupling coefficient κ of the diffraction grating by a diffraction grating length Lg is set to 1 or more, and selectively returns light to the radiation side by the effective reflectivity of the diffraction grating being 98% or higher. By setting these parameters, multimode operation of the laser device having a diffraction grating on a light reflecting side can be achieved. Examples of devices having a diffraction grating provided in the vicinity of the radiation side reflecting film may be found in U.S. patent application Ser. No. 09/983,175, filed on Oct. 23, 2001, which is incorporated herein by reference. As seen in FIG. 22, a window structure region 25b is provided between the diffraction grating 13b and the reflection film 14, and the window structure region 25b is the same as the window structure region 25a shown in the second embodiment that comprises Fe-doped InP. The window structure region 25b and the reflection film 14 reduce the effective reflectivity to less than 1% and more preferably 0.1%. In this case, since the reflectivity of the reflection film 14 and the window structure region 25b are less than 1%, reflection on the reflection end surface is almost entirely eliminated and it is possible to suppress unstable output caused by phase mismatch between the diffraction grating 13b and the reflection film 14. That is, it is possible to suppress the oscillation of the Fabry-Perot mode caused by the reflection film 14 and the radiation side reflection film 15.

FIG. 23 is a vertical sectional view in the longitudinal direction of a semiconductor laser device having a diffraction grating and window structure on both the light reflecting side and the light emitting side of the device in accordance with the present invention. In this case, a bidirectional effect of the semiconductor laser device shown in FIG. 11 and the semiconductor laser device shown in FIGS. 22 can be obtained. Although the semiconductor laser device shown in FIGS. 22 and 23 have a window structure region corresponding to the second embodiment of the present invention, it is to be understood that a window structure region shown in the first and third embodiments may also be used.

In each of the embodiments described above, the periodically spaced material of the diffraction grating 13 is equally spaced and has a constant pitch. However, it is to be understood that the grating material may have different spacings and pitches in order to achieve the desired multiple oscillation modes from the laser device.

FIG. 24 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The semiconductor laser device 51 is preferably provided in a junction down configuration in which the p-side electrode is joined to the heat sink 57a, which is mounted on the base 57. A back face monitor photo diode 56 is also disposed on a base 57 which functions as a heat sink and is attached to a temperature control device 58 mounted on the metal package 59 of the laser module 50. The back face monitor photo diode 56 acts as a current monitor to detect a light leakage from the reflection coating side of the semiconductor laser device 51.

The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Figure 25:
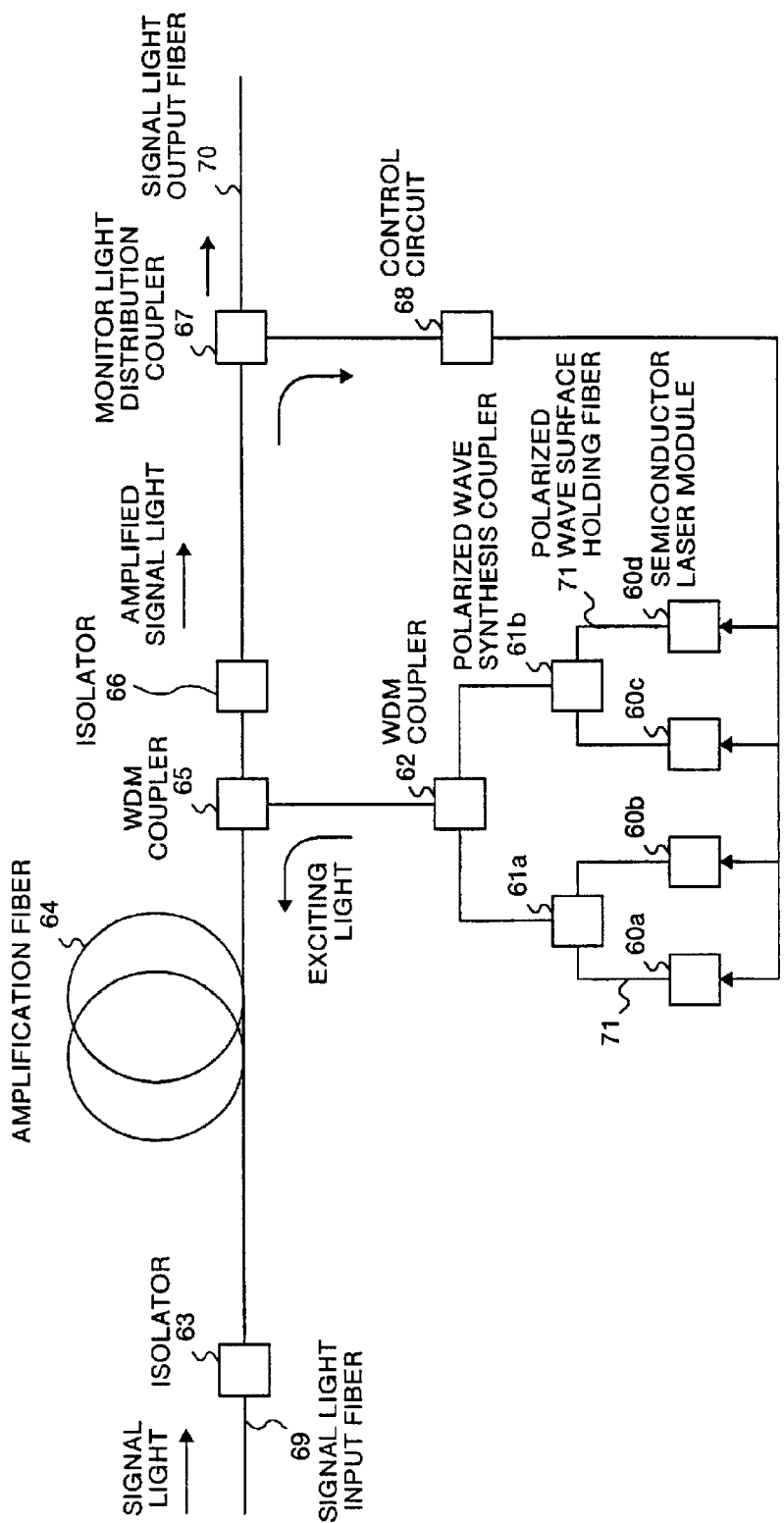
FIG. 25 is a block diagram illustrating a configuration of a Raman amplifier used in a WDM communication system in accordance with the present invention.

In FIG. 25, semiconductor laser modules 60a through 60d are of the type described in the embodiment of FIG. 24. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61 a and 61b, and outputs the multiplexed light beams as a pumping light beam to amplifying fiber 64 via WDM coupler 65. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light outputs as an output laser beam to signal light outputting fiber 70.

The control circuit 68 controls a light-emitting state, for example, an optical intensity, of each of the semiconductor laser module 60a through 60d based on the portion of the amplified signal light beams input to the control circuit 68. This optical intensity of the Raman amplifier output is used along with the monitor current photodiode 56 of the laser module in FIG. 26 to control the output of the semiconductor lasers of each module. Thus, control circuit 68 performs feedback control of a gain band of the Raman amplification such that the gain band will be flat over wavelength.

Figure 26:
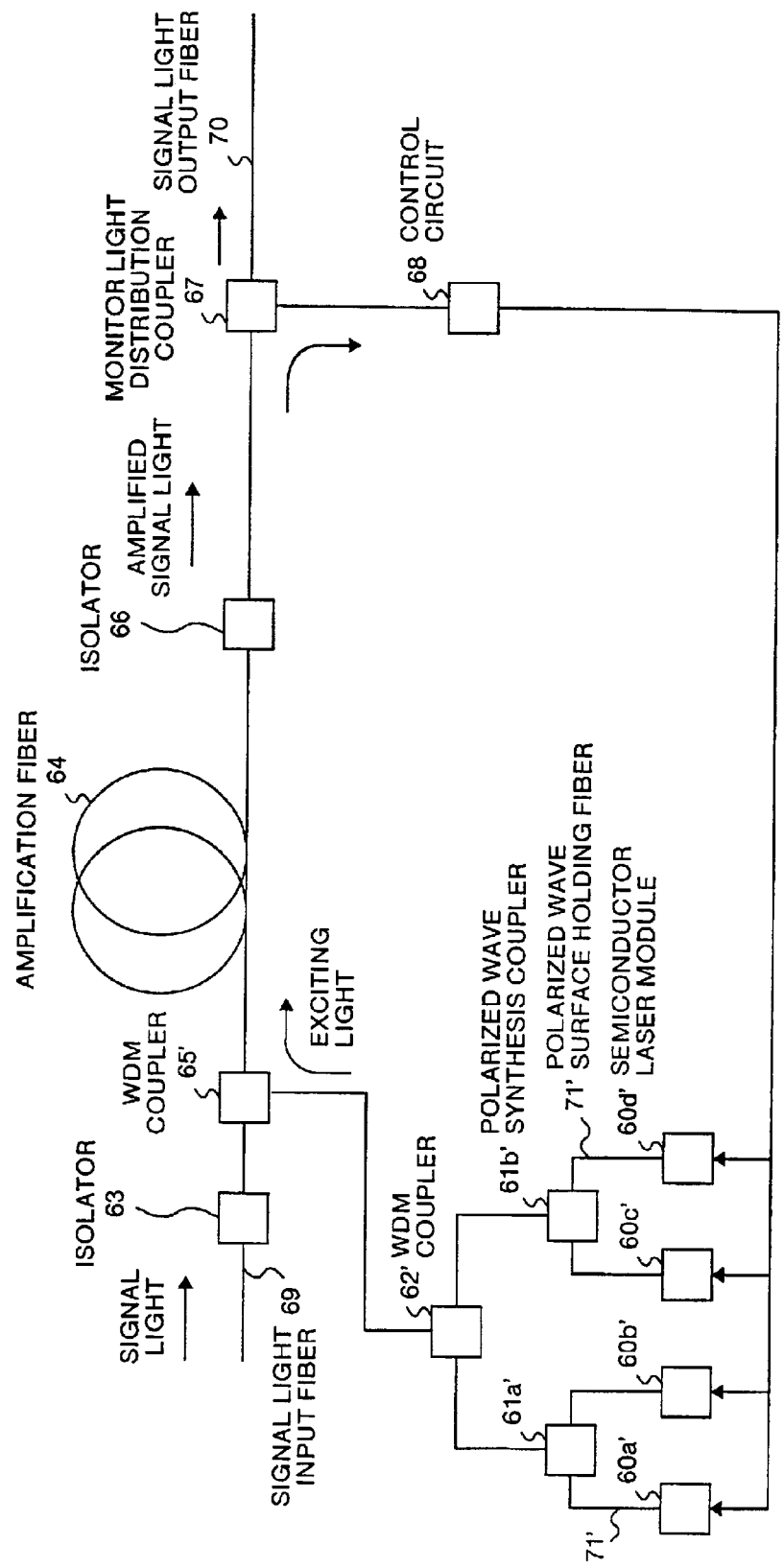
FIGS. 26 and 27 show a block diagram illustrating a configuration of the Raman amplifier of FIG. 25, used in a WDM communication system in a forward and bidirectional pumping method respectively, in accordance with the present invention.
Figure 27:
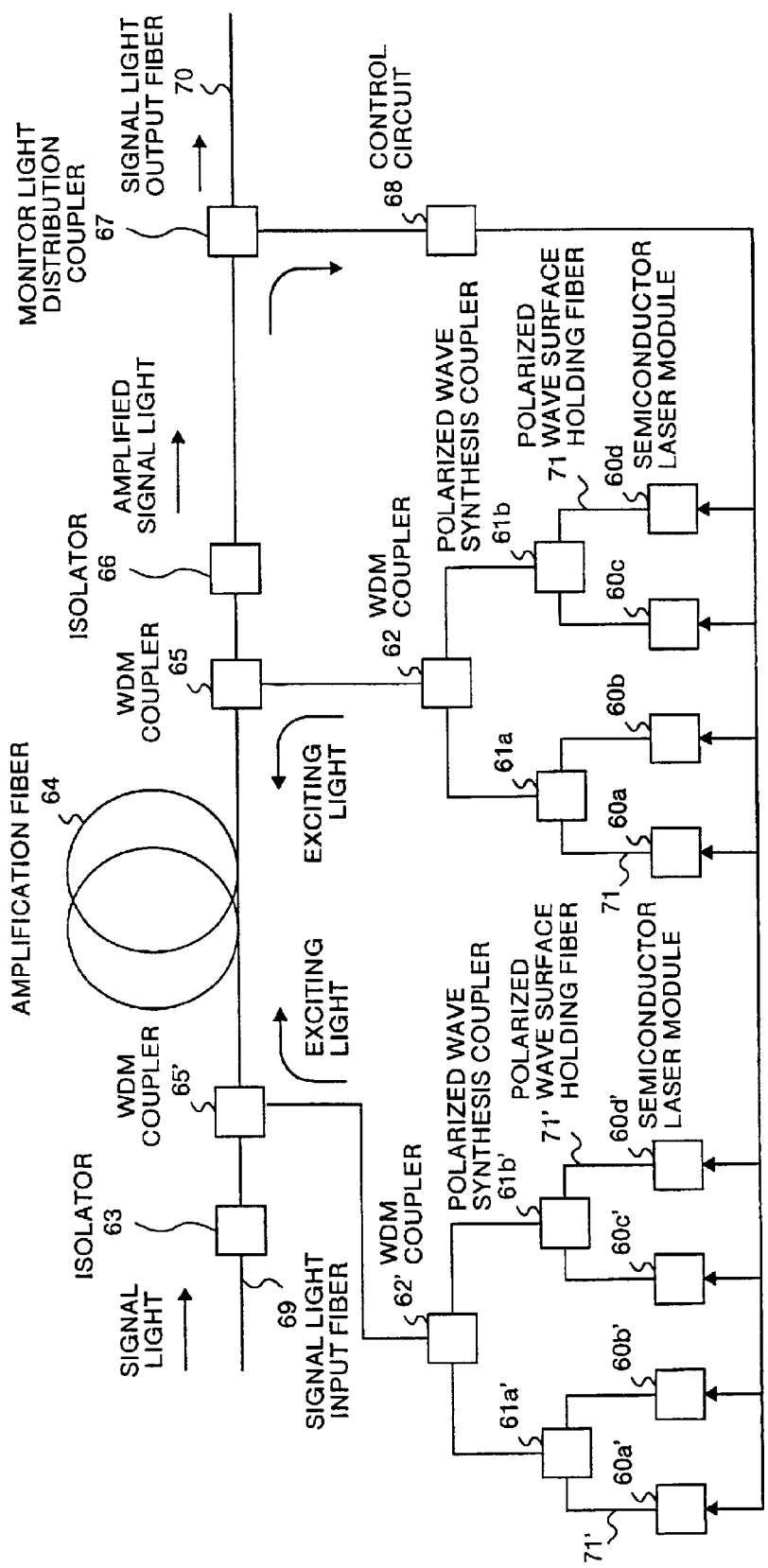
Figure 28:
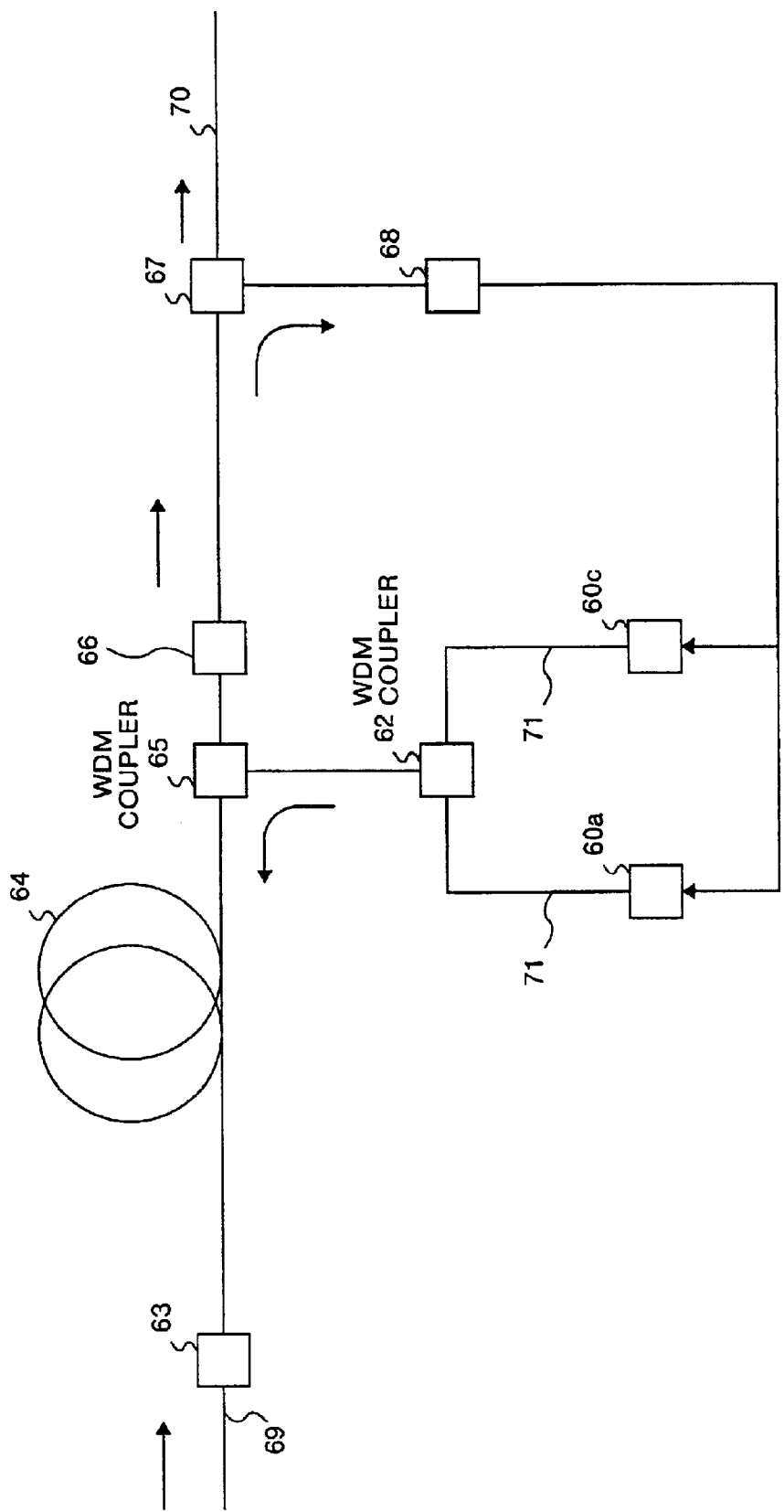
FIG. 28 is a block diagram illustrating a configuration of a Raman amplifier in which polarization dependent gain is suppressed by depolarizing a pumping light beam output from a single semiconductor laser device using polarization maintaining fibers as a depolarizer, in accordance with an embodiment of the present invention.
Figure 29:
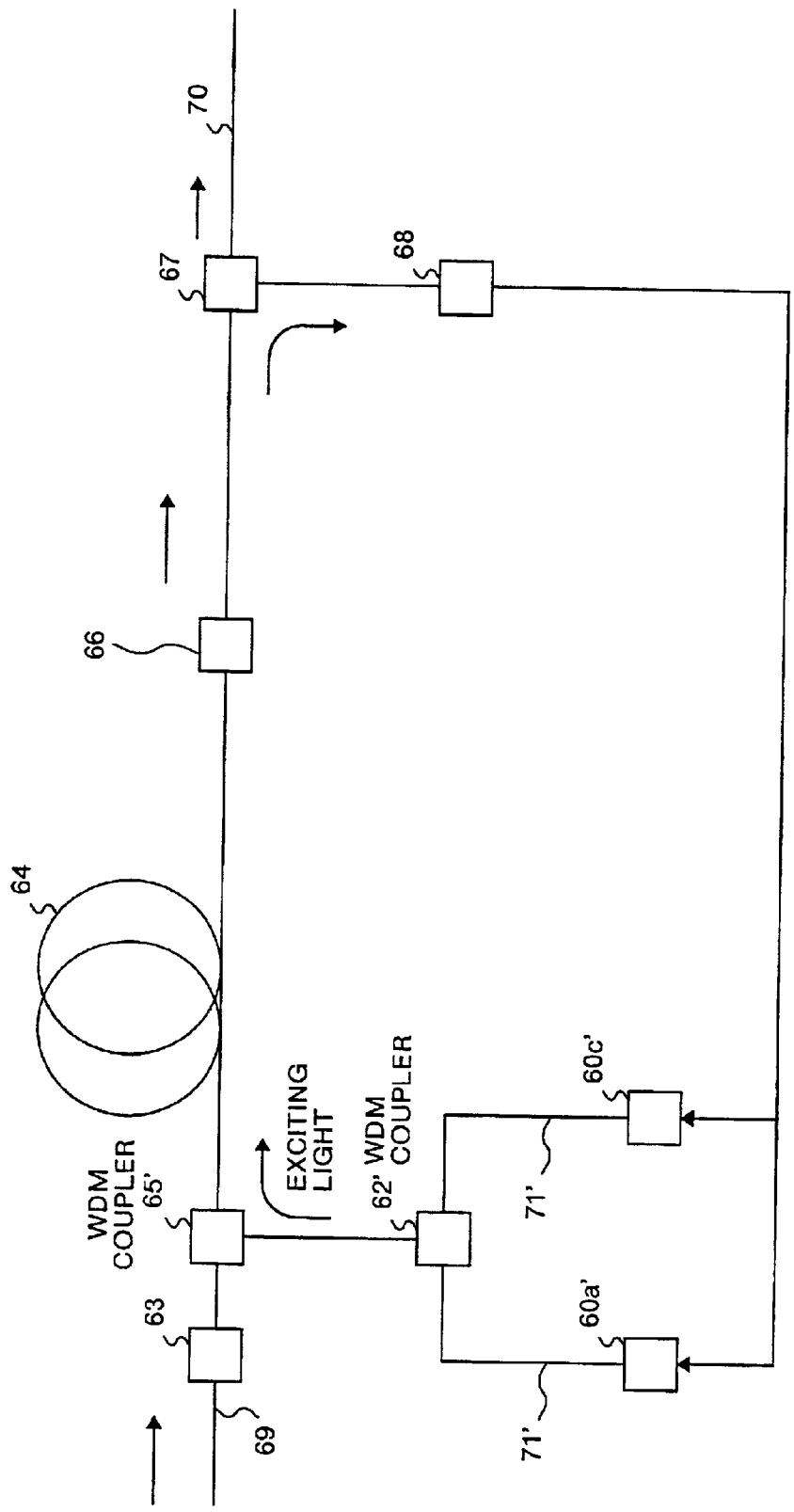
FIGS. 29 and 30 show a block diagram illustrating a configuration of the Raman amplifier used in a WDM communication system in a forward and bidirectional pumping method respectively, in accordance with the present invention.
Figure 30:
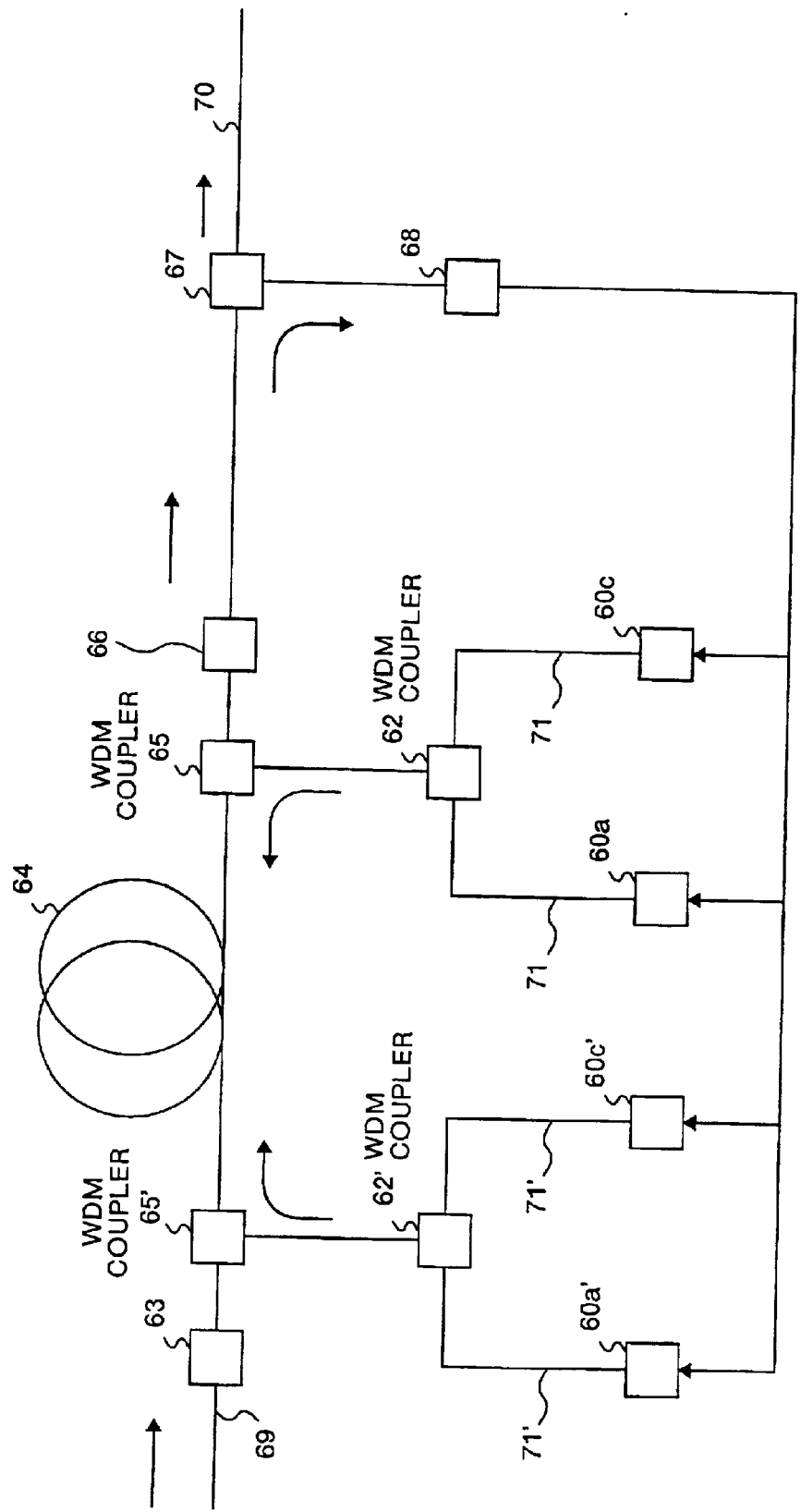

Although the Raman amplifier illustrated in FIG. 25 is the backward pumping method, it is to be understood that the semiconductor laser device, module and Raman amplifier of the present invention may be used with a forward pumping method as shown in FIG. 26, or the bi-directional pumping method as shown in FIG. 27. Moreover, the Raman amplifier can be constructed by wavelength-multiplexing of a plurality of pumping light sources which are not polarization-multiplexed. That is, the semiconductor laser module of the present invention can be used in a Raman amplifier where the polarization-multiplexing of pumping light is not performed. FIG. 28 is a block diagram illustrating a configuration of a Raman amplifier in which polarization dependent gain is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees. Finally, it is to be understood that the semiconductor laser device, module and Raman amplifier of the present invention shown in FIG. 28 may be used with a forward pumping method as shown in FIG. 29, or the bidirectional pumping method as shown in FIG. 30.

Figure 31:
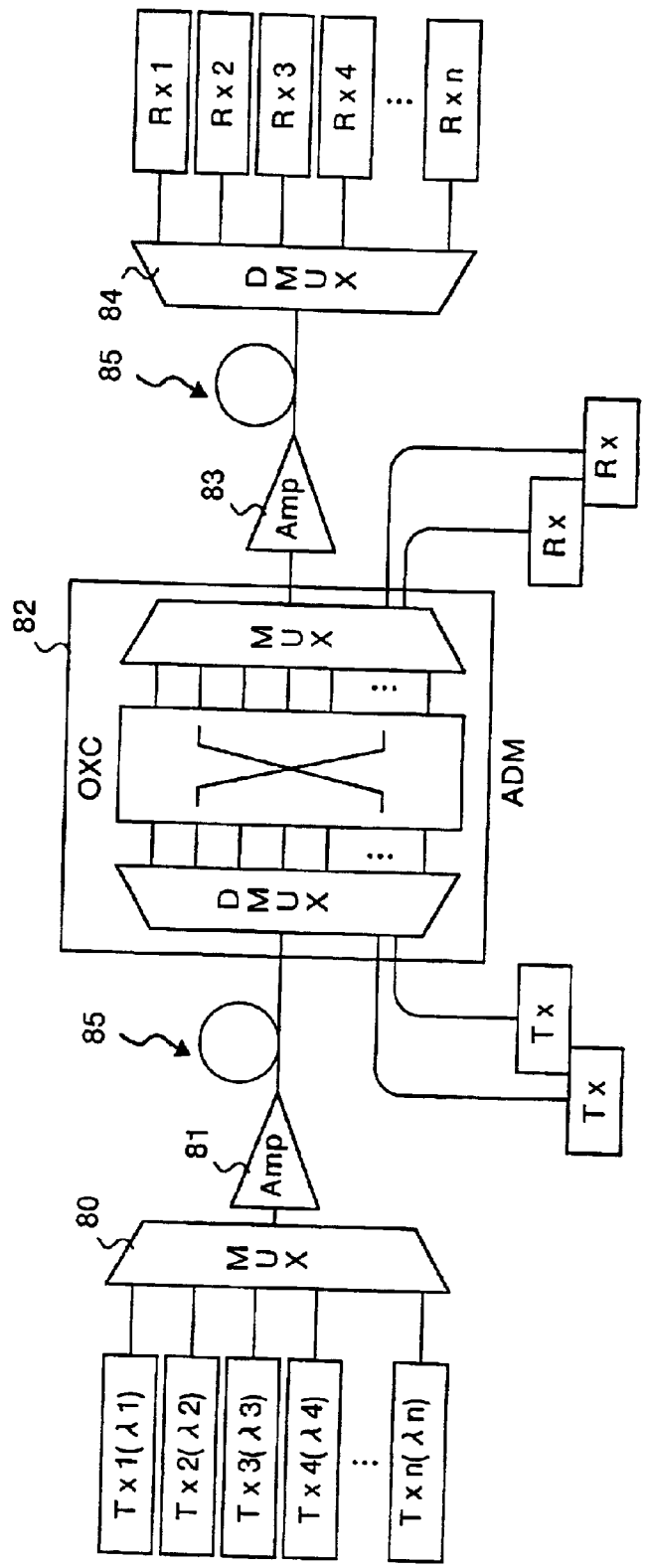
FIG. 31 is a block diagram illustrating a general configuration of the WDM communication system to which the Raman amplifier shown in any of FIGS. 25–30 is applied.

The Raman amplifier illustrated in FIGS. 25–30 can be applied to the WDM communication system as described above. FIG. 31 is a block diagram illustrating a general configuration of the WDM communication system to which the Raman amplifier shown in any of FIGS. 25–30 is applied.

In FIG. 31, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 21 or FIG. 22 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A multiple mode semiconductor laser device comprising:
    an active layer configured to radiate light;
    a light reflecting facet positioned on a first side of said active layer;
    a light emitting facet positioned on a second side of said active layer thereby forming a resonator between said light reflecting facet and said light emitting facet;
    a diffraction grating positioned within said resonator along a portion of the length of said active layer; and
    a window structure provided between an end of said active layer and one of said light reflecting and light emitting facets, said window structure being configured to reduce a reflectivity of said one of the light reflecting and light emitting facets, wherein at least one of said diffraction grating and a length of said resonator is configured to cause said laser device operate as a multiple mode oscillation device.

2. The semiconductor laser device of claim 1, wherein said window structure is provided between a light emitting end of the active layer and the light emitting facet.

3. The semiconductor laser device of claim 2, wherein said light emitting facet comprises a reflective coating that provides a reflectivity Ro of approximately 10%, approximately 5%, approximately 1%, approximately 0.5%, or approximately 0.1%.

4. The semiconductor laser device of claim 3, wherein said window structure has a length Lw sufficient to provide an effective reflectivity Reff of less than 0.1% for the light emitting facet.

5. The semiconductor laser device of claim 3, wherein said window structure has a length Lw sufficient to provide an effective reflectivity Reff of less than 1% for the light emitting facet.

6. The semiconductor device of claim 1, wherein a length of said partial diffraction grating and a length of said resonator are set to meet the inequality:

$$Lg \times (1300/L) \leq 300,$$

where Lg is the predetermined length of the partial diffraction grating in $\mu$m, and L is the length of the resonator in $\mu$m.

7. The semiconductor device of claim 1, wherein a length and a coupling coefficient of said diffraction grating are set to meet the inequality:

$$\kappa \cdot Lg \leq 0.3,$$

where $\kappa$ is the coupling coefficient of the diffraction grating, and

Lg is the length of the diffraction grating.

8. The semiconductor laser device of claim 1, wherein said window structure is provided between a light reflecting end of the active layer and the light reflecting facet.

9. The semiconductor laser device of claim 8, wherein said light reflecting facet comprises a reflective coating that provides a reflectivity Ro of approximately 10%, approximately 5%, approximately 1%, approximately 0.5%, or approximately 0.1%.

10. The semiconductor laser device of claim 9, wherein said window structure has a length Lw sufficient to provide an effective reflectivity Reff of less than 1%.

11. The semiconductor laser device of claim 9, wherein said window structure has a length Lw sufficient to provide an effective reflectivity Reff of less than 0.1%.

12. The semiconductor device of claim 8, wherein a length of said partial diffraction grating and a length of said resonator are set to meet the inequality:

$$Lg \leq 1/2L,$$

where Lg is the predetermined length of the partial diffraction grating in $\mu$m, and L is the length of the resonator in $\mu$m.

13. The semiconductor device of claim 8, wherein a length and a coupling coefficient of said partial diffraction grating is set to meet the inequality:

$$\kappa \cdot Lg \geq 1,$$

where $\kappa$ is the coupling coefficient of the diffraction grating, and

Lg is the length of the diffraction grating.

14. The semiconductor laser device of claim 1, wherein said window structure is provided between a light emitting end of the active layer and the light emitting facet, said semiconductor laser device further comprising a second window structure provided between a light reflecting end of the active layer and the light reflecting facet.

15. The semiconductor laser device of claim 1, further comprising current blocking layers having the active layer interposed therebetween, wherein said window structure comprises the same material as the current blocking layers.

16. The semiconductor laser device of claim 1, wherein said window structure comprises buried structure of Fe doped InP material.

17. The semiconductor laser device of claim 1, wherein said window structure comprises a disordered crystal extending from said active layer.

18. The semiconductor laser device of claim 17, wherein said disordered portion comprises Zn atoms.

19. The semiconductor laser device of claim 17, wherein said disordered portion comprises point defects.

20. The semiconductor laser device of claim 1, further comprising an optical waveguide positioned between an end of the active layer and one of the light emitting and light reflecting facets.

21. The semiconductor laser device of claim 1, further comprising a current suppression structure positioned adjacent to said window structure and configured to suppress current in said window structure.

22. A method for providing light from a multiple mode semiconductor device comprising:

radiating light from an active layer of the device;

providing a light reflecting facet positioned on a first side of said active layer, and a light emitting facet positioned on a second side of said active layer thereby forming a resonator between said light reflecting facet and said light emitting facet;

providing a diffraction grating positioned within said resonator along a portion of the length of said active layer to select a multiple longitudinal mode oscillation output light for emitting from the light emitting facet; and suppressing Fabry-Perot oscillations by providing a window structure interposed between an end of said active layer and one of said light reflecting and light emitting facets.

23. The method of claim 22, wherein said suppressing Fabry-perot oscillations comprises providing a window structure between a light emitting end of the active layer and the light emitting facet.

24. The method of claim 23, further comprising coating said light emitting facet with a reflective coating that provides a reflectivity Ro of approximately 10%, approximately 5%, approximately 1%, approximately 0.5%, or approximately 0.1%.

25. The method of claim 23, wherein said suppressing Fabry-perot oscillations comprises providing said window structure with a length Lw sufficient to provide an effective reflectivity Reff of less than 0.1% for the light emitting facet.

26. The method of claim 22, wherein said suppressing Fabry-perot oscillations comprises providing a window structure between a light reflecting end of the active layer and the light reflecting facet.

27. The method of claim 26, further comprising coating said light reflecting facet with a reflective coating that provides a reflectivity Ro of approximately 10%, approximately 5%, approximately 1%, approximately 0.5%, or approximately 0.1%.

28. The method of claim 26, wherein said suppressing Fabry-perot oscillations comprises providing said window structure with a length Lw sufficient to provide an effective reflectivity Reff of less than 1% for the light reflecting facet.

29. The method of claim 22, wherein said suppressing Fabry-perot oscillations comprises:
providing a window structure between a light emitting end of the active layer and the light emitting facet; and
providing a second window structure between a light reflecting end of the active layer and the light reflecting facet.

30. The method of claim 22, further comprising providing an optical waveguide positioned between an end of the active layer and one of the light emitting and light reflecting facets.

31. The method of claim 22, further comprising providing a current suppression region corresponding to said window structure.

32. A multiple mode semiconductor laser device comprising:
means for radiating light from an active layer of said device in the presence of an injection current;
means for oscillating said radiated light within a cavity and emitting a portion of said radiated light from the laser device as a multiple longitudinal mode output beam;
means for selecting said portion of said radiated light to be emitted by said semiconductor laser device; and
means for suppressing Fabry-perot oscillations of said means for oscillating.

33. The semiconductor laser device of claim 32, further comprising means for suppressing current in an area of the semiconductor device corresponding to said means for suppressing Fabry-Perot oscillations said means for suppressing current positioned adjacent to the means for suppressing Fabry-perot oscillations.

34. A multiple mode semiconductor laser module comprising:
a semiconductor laser device comprising:
an active layer configured to radiate light,
a light reflecting facet positioned on a first side of said active layer,
a light emitting facet positioned on a second side of said active layer thereby forming a resonator between said light reflecting facet and said light emitting facet,
a diffraction grating positioned within said resonator along a portion of the length of said active layer, and
a window structure interposed between an end of said active layer and one of said light reflecting and light emitting facets, said window structure being configured to reduce a reflectivity of said one of the light reflecting and light emitting facets,
wherein at least one of said diffraction grating and a length of said resonator is configured to operate as a multiple mode oscillation device; and
a wave guide device for guiding said laser beam away from the semiconductor laser device.

35. An optical fiber amplifier comprising:
a multiple mode semiconductor laser device comprising:
an active layer configured to radiate light,
a light reflecting facet positioned on a first side of said active layer,
a light emitting facet positioned on a second side of said active layer thereby forming a resonator between said light reflecting facet and said light emitting facet,
a diffraction grating positioned within said resonator along a portion of the length of said active layer, and
a window structure interposed between an end of said active layer and one of said light reflecting and light emitting facets, said window structure being configured to reduce a reflectivity of said one of the light reflecting and light emitting facets,
wherein at least one of said diffraction grating and a length of said resonator is configured to operate as a multiple mode oscillation device; and
an amplifying fiber coupled to said semiconductor laser device and configured to amplify a signal by using said light beam as an excitation light.

36. A wavelength division multiplexing system comprising:
a transmission device configured to provide a plurality of optical signals having different wavelengths;
an optical fiber amplifier coupled to said transmission device and including a multiple mode semiconductor laser device comprising:
an active layer configured to radiate light,
a light reflecting facet positioned on a first side of said active layer,
a light emitting facet positioned on a second side of said active layer thereby forming a resonator between said light reflecting facet and said light emitting facet,
a diffraction grating positioned within said resonator along a portion of the length of said active layer, and
a window structure interposed between an end of said active layer and one of said light reflecting and light emitting facets, said window structure being configured to reduce a reflectivity of said one of the light reflecting and light emitting facets,
wherein at least one of said diffraction grating and a length of said resonator is configured to operate as a multiple mode oscillation device; and
a receiving device coupled to said optical fiber amplifier and configured to receive said plurality of optical signals having different wavelengths.

37. A Raman amplifier comprising:
a multiple mode semiconductor laser device comprising:
an active layer configured to radiate light,
a light reflecting facet positioned on a first side of said active layer,
a light emitting facet positioned on a second side of said active layer thereby forming a resonator between said light reflecting facet and said light emitting facet,
a diffraction grating positioned within said resonator along a portion of the length of said active layer, and
a window structure interposed between an end of said active layer and one of said light reflecting and light emitting facets, said window structure being configured to reduce a reflectivity of said one of the light reflecting and light emitting facets,
wherein at least one of said diffraction grating and a length of said resonator is configured to operate as a multiple mode oscillation device; and
a fiber coupled to said semiconductor laser device and configured to carry a signal that is amplified based on said light beam being applied to said fiber.

38. The Raman amplifier of claim 37, wherein said semiconductor laser device is coupled to said fiber at an input side of said fiber such that said light beam is applied as a forward pumping method.

39. The Raman amplifier of claim 37, wherein said semiconductor laser device is coupled to said fiber at an output side of said fiber such that said light beam is applied as a backward pumping beam.

40. The Raman amplifier of claim 37, wherein said semiconductor laser device is coupled to said fiber at both an input and output side of said fiber such that said light beam is applied as both a forward and backward pumping beam.

* * * * *